United States Patent
Lee et al.

(10) Patent No.: US 7,936,994 B2
(45) Date of Patent: May 3, 2011

(54) BROADBAND LIGHT SOURCE USING FABRY PEROT LASER DIODES

(75) Inventors: Chang-Hee Lee, Daejeon (KR);
Jin-serk Baik, Gyeonggi-do (KR);
Ki-Man Choi, Daegu (KR); Hyun-Sik Min, Busan (KR); Keun-Youl Park, Busan (KR)

(73) Assignee: Korea Advanced Institute of Science and Technology, Taejon (KR)

( * ) Notice: Subject to any disclaimer, the term of this patent is extended or adjusted under 35 U.S.C. 154(b) by 1023 days.

(21) Appl. No.: 11/575,604

(22) PCT Filed: Dec. 22, 2004

(86) PCT No.: PCT/KR2004/003406
§ 371 (c)(1),
(2), (4) Date: Mar. 20, 2007

(87) PCT Pub. No.: WO2006/068335
PCT Pub. Date: Jun. 29, 2006

(65) Prior Publication Data
US 2008/0131127 A1 Jun. 5, 2008

(51) Int. Cl.
*H04J 14/02* (2006.01)
(52) U.S. Cl. ......................................... 398/90
(58) Field of Classification Search ............ 398/90
See application file for complete search history.

(56) References Cited

U.S. PATENT DOCUMENTS

| 5,307,366 A | 4/1994 | Auffret et al. |
| 5,434,662 A | 7/1995 | Rockwell et al. |
| 6,178,001 B1 | 1/2001 | Kim |
| 6,208,672 B1 * | 3/2001 | Gunning et al. ............... 372/12 |
| 6,654,401 B2 | 11/2003 | Cavalheiro Vieira et al. |
| 2001/0004290 A1 | 6/2001 | Lee et al. |
| 2002/0068859 A1 | 6/2002 | Knopp |
| 2006/0120417 A1 * | 6/2006 | Wang et al. ..................... 372/30 |
| 2009/0196612 A1 * | 8/2009 | Lee et al. ........................ 398/72 |

FOREIGN PATENT DOCUMENTS

| EP | 0844706 A2 | 5/1998 |
| EP | 0844706 A3 | 5/1998 |
| KR | 1020010063062 A | 7/2001 |
| KR | 10-2002-0325687 | 2/2002 |

OTHER PUBLICATIONS

Petermann, K., "Laser Diode Modulation and Noise," Kluwer Academic Publishers, London 1988.

(Continued)

*Primary Examiner* — Nathan M Curs
(74) *Attorney, Agent, or Firm* — Blakely, Sokoloff, Taylor & Zafman LLP

(57) ABSTRACT

Disclosed is a broadband light source (BLS) necessary to implement wavelength-locked Fabry-Perot (FP) laser diodes (LDs) applicable to an optical subscriber network The BLS is based on a method using mutual injection of low-cost FP LDs and a method using FP LDs undergoing chirping. A power level of a light emitting diodes (LED), an erbium-doped fiber amplifier (EDFA), or a super luminescent diode (SLD) used as the conventional BLS is low and its cost is high, such that the conventional BLS is inefficient. However, the present invention can easily implement a low-cost BLS using proposed FP LDs.

29 Claims, 20 Drawing Sheets

OTHER PUBLICATIONS

Noise Characteristics of Solitary Diodes, Section 7.3.2 Mode Partition Noise, pp. 163-166, 1988.

Oh, Tae-Won et al., "Broadband Light Source for Wavelength-Division Multiple Access Passive Optical Network," Dept. of Elec. Eng., Korea Adv. Institute of Science and Tech., and Novera Optics Korea, Inc. Nov. 29, 2007.

PCT International Search Report and Written Opinion for PCT/KR2004/003406, mailed Sep. 26, 2005, 5 pages.

* cited by examiner (a)

(b)

(a)

(b)

BROADBAND LIGHT SOURCE USING FABRY PEROT LASER DIODES

TECHNICAL FIELD

The present invention relates to a broadband light source (BLS) applicable to a wavelength division multiplexing-passive optical network (WDM-PON) system, and more particularly to a BLS using mutual injection or chirping of low-cost Fabry-Perot (FP) laser diodes (LDs).

BACKGROUND ART

Conventional subscriber networks are constructed by an asymmetric digital subscriber line (ADSL) or very-high-speed digital subscriber line (VDSL) using a telephone line, or a cable modem using a coaxial cable. Because the above-mentioned structure uses a copper wire, its capacity is limited to a maximum of 52 Mbps according to a transmission distance. When an increased amount of data traffic, and various multimedia services such as high definition television (HDTV), e-commerce, video on demand (VOD), etc. are taken into account, capacity of existing subscriber networks needs to be extended. To extend the network capacity, a large amount of research is being performed on a wavelength division multiplexing-passive optical network (WDM-PON) system based on an optical fiber.

In the WDM-PON system, one wavelength per subscriber must be assigned. Accordingly, one light source per subscriber is required, thereby increasing economic burden on the subscriber. That is, when a distributed feedback (DFB) laser diode (LD) in which an oscillating wavelength is fixed is used as a fixed light source per subscriber, it is difficult for the DFB LD to be commercialized because the cost of the DFB LD is high. Accordingly, a key of the WDM-PON technology is to implement a low-cost light source.

There is an advantage in that the cost of a Fabry-Perot (FP) laser diode (LD) is low. However, the FP LD is not appropriate to be used as a light source in the WDM-PON system due to mode partition noise [1].

Another method for implementing the low-cost light source for the WDM-PON uses a wavelength-locked FP LD [3]. The method using the wavelength-locked FP LD injects a wavelength of an incoherent light source into the FP LD oscillating in multimode, fixes an oscillating wavelength of the FP LD to the injected wavelength, and enables the FP LD to oscillate in single mode, thereby generating a WDM light source.

For example, a light emitting diode (LED), an erbium-doped fiber amplifier (EDFA) for generating amplified spontaneous emission (ASE), or a super luminescent diode (SLD) are used as a broadband light source for wavelength injection into the wavelength-locked FP LD [2] and [3].

REFERENCES

[1] K. Petermann, "Laser diode modulation and noise", Kluwer Academic Publishers, London, 1988.
[2] Tae-Won Oh, et al., "Broadband light source for wavelength-division multiple access passive optical network", Optoelectronics and Communication Conference (OECC), 2003.
[3] Chang-Hee Lee and Hyun-Deok Kim, "Fabry-Perot laser diode light source for optical communication based on WDM wavelength-locked to injected incoherent light", Korean Patent No. 10-2002-0325687 (Feb. 28, 2002).

DISCLOSURE

Technical Problem

However, there is a problem in that a power level of an LED, EDFA, or SLD used as the conventional BLS is low and its cost is high, such that the conventional BLS is inefficient.

Therefore, it is an object of the present invention to implement a broadband light source (BLS) that produces a broad spectrum and high power using low-cost Fabry-Perot (FP) laser diodes (LDs).

Technical Solution

The above and other objects can be accomplished by a method for generating a first broadband light source using Fabry-Perot (FP) laser diodes (LDs), comprising: generating the broadband light source by broadening an oscillation line-width of laser oscillation mode generated from at least two FP LDs by mutual injection of the at least two FP LDs.

The above and other objects can be accomplished by a method for generating a second broadband light source using Fabry-Perot (FP) laser diodes (LDs), comprising: generating the broadband light source by inducing chirping of a plurality of FP LDs in a way that directly modulates the plurality of FP LDs at a higher frequency than that of a desired transmission rate and by broadening an oscillation line-width of laser oscillation mode.

When light is filtered in one of oscillation modes and the filtered light is injected into FP LDs, wavelength-locked FP LDs can be implemented.

The above and other objects can be accomplished by a third broadband light source using Fabry-Perot (FP) laser diodes (LDs), comprising: a pair of FP LDs for generating multi-mode light; and an optical coupler for coupling outputs of the pair of FP LDs, wherein output ports of the pair of FP LDs are coupled to each other such that photons are injected between the pair of FF LDs.

The above and other objects can be accomplished by a fourth broadband light source using Fabry-Perot (FP) laser diodes (LDs), comprising: N number of FP LDs for generating multimode light; and an optical coupler for coupling outputs of the N FP LDs, wherein output ports of the N FP LDs are coupled to one another such that photons are injected between the N FP LDs.

The above and other objects can be accomplished by a fifth broadband light source using a Fabry-Perot (FP) laser diode (LD), comprising: an FP LD for generating multimode light; and a frequency generator for inducing chirping of the FP LD.

The above and other objects can be accomplished by a sixth broadband light source using Fabry-Perot (FP) laser diodes (LDs), comprising: N number of FP LDs for generating multimode light; a frequency generator for inducing chirping of the N FP LD; and an optical coupler for coupling outputs of the N FP LDs.

The above and other objects can be accomplished by an optical transmitter, comprising: the first, third, or fourth broadband light source; a first arrayed waveguide grating (AWG) for filtering light into n number of light components in a plurality of oscillation modes of the broadband light source, where n is the number of output ports of the first AWG or the number of wavelength division multiplexing (WDM) signal channels; an optical fiber for transmission; n number of Fabry-Perot (FP) laser diodes (LDs) for outputting light wavelength-locked to a light wavelength injected through the first AWG; an optical circulator for outputting light input through the first AWG; and a second AWG for demultiplexing a WDM signal into n number of signals.

The above and other objects can be accomplished by an optical transmitter, comprising: the second, fifth, or sixth broadband light source; a first arrayed waveguide grating (AWG) for filtering light into n number of light components in a plurality of oscillation modes of the broadband light source, where n is the number of output ports of the first AWG or the number of wavelength division multiplexing (WDM) signal channels; an optical fiber for transmission; n number of Fabry-Perot (FP) laser diodes (LDs) for outputting light wavelength-locked to a light wavelength injected through the first AWG; an optical circulator for outputting light input through the first AWG; and a second AWG for demultiplexing a WDM signal into n number of signals.

The above and other objects can be accomplished by a method for generating an unpolarized broadband light source using one of the first to sixth broadband light sources, comprising: using outputs of two output ports of one polarized broadband light source, or dividing and using an output of one output port of one polarized broadband light source, in two polarized broadband light sources for multiplexing polarized light.

When the outputs of the two output ports of the one polarized broadband light source in the two polarized broadband light sources for multiplexing polarized light are used, the outputs of the two output ports of the one polarized broadband light source are controlled by first and second polarization controllers, respectively, such that the outputs can be horizontally and vertically polarized light components, and the horizontally and vertically polarized light components are passed to a polarization beam splitter. Alternatively, when the outputs of the two output ports of the one polarized broadband light source in the two polarized broadband light sources for multiplexing polarized light are used, one of the outputs of the two output ports of the one polarized broadband light source is adjusted to be vertical to polarized light of the other output by a wave plate, and polarized light components vertical to each other are passed to a polarization maintaining coupler. Alternatively, when the outputs of the two output ports of the one polarized broadband light source in the two polarized broadband light sources for multiplexing polarized light are used, polarized light components of the outputs of the two output ports of the one polarized broadband light source are adjusted to be vertical to each other by at least one polarization controller, and the polarized light components vertical to each other are passed to a polarization maintaining coupler.

When the output of the one output port of the one polarized broadband light source in the two polarized broadband light sources for multiplexing polarized light is divided and used, the output of the one output port of the one polarized broadband light source is separated into two components by a 1×2 optical coupler, the two components of the optical coupler are adjusted to be horizontally and vertically polarized light components by first and second polarization controllers, and the horizontally and vertically polarized light components are passed to a polarization beam splitter. Alternatively, when the output of the one output port of the one polarized broadband light source in the two polarized broadband light sources for multiplexing polarized light is divided and used, the output of the one output port of the one polarized broadband light source is separated into two components by a 1×2 optical coupler, one component output from the optical coupler is adjusted to be vertical to polarized light of the other component by a wave plate, and polarized light components vertical to each other are passed to a polarization maintaining coupler. Alternatively, when the output of the one output port of the one polarized broadband light source in the two polarized broadband light sources for multiplexing polarized light is divided and used, polarized light components generated from the output of the one output port of the one polarized broadband light source are adjusted to be vertical to each other by at least one polarization controller, and the polarized light components vertical to each other are passed to a polarization maintaining coupler.

The above and other objects can be accomplished by an optical transmitter comprising: an unpolarized broadband light source; a first arrayed waveguide grating (AWG) for filtering light into n number of light components in a plurality of oscillation modes of the unpolarized broadband light source, where n is the number of output ports of the first AWG or the number of wavelength division multiplexing (WDM) signal channels; an optical fiber for transmission; n number of Fabry-Perot (FP) laser diodes (LDs) for outputting light wavelength-locked to a light wavelength injected through the first AWG; an optical circulator for outputting light input through the first AWG; and a second AWG for demultiplexing a WDM signal into n number of signals.

The present invention provides a broadband light source (BLS) that has a simple structure using low-cost FP LDs and can produce a desired power output at low cost.

The present invention has two technical features. In accordance with the first technical feature, the spectrum of oscillation mode is broadened through mutual injection of the FP LDs, such that the broadened spectrum is used in the BLS. In accordance with the second technical feature, the spectrum is broadened using chirping generated when a signal of an FP LD is modulated into a large signal, such that the broadened spectrum is used in the BLS.

Advantageous Effects

The present invention can utilize a Fabry-Perot (FP) laser diode (LD) wavelength-locked by injection of a broadband light source (BLS) as a low-cost light source in optical communication based on a wavelength division multiplexing-passive optical network (WDM-PON) system.

BEST MODE

Now, preferred embodiments of the present invention will be described in detail with reference to the accompanying drawings.

Figure 1:
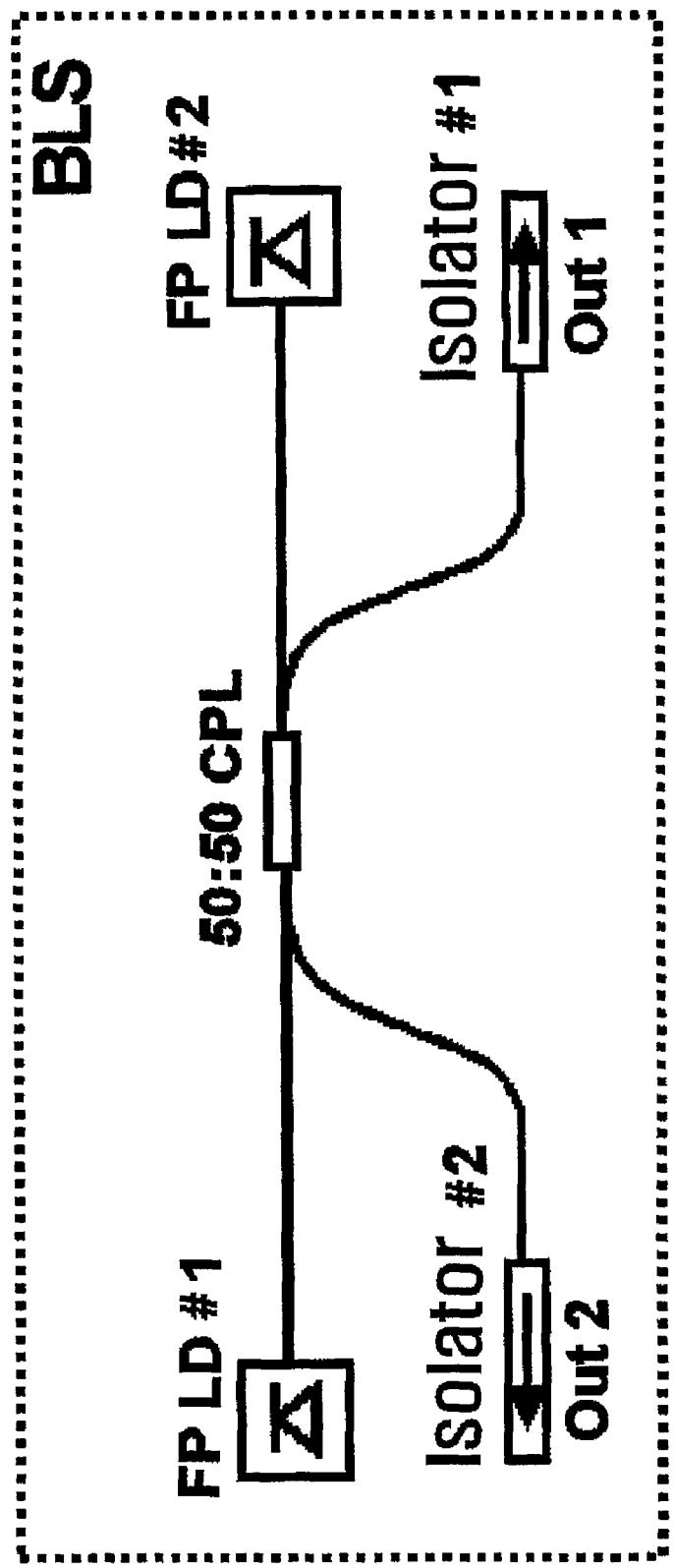
FIG. 1 illustrates a broadband light source (BLS) using mutual injection of Fabry-Perot (FP) laser diodes (LDs) in accordance with a first embodiment of the present invention.

FIG. 1 illustrates a broadband light source (BLS) using mutual injection of Fabry-Perot (FP) laser diodes (LDs) in accordance with a first embodiment of the present invention. The BLS includes FD LDs #1 and #2, a 50:50 coupler (CPL) for coupling outputs of the FD LDs #1 and #2, and isolators #1 and #2.

Output ports of the FD LDs #1 and #2 are coupled to each other. Photon injection occurs between the FD LDs #1 and #2. The photon injection occurring between the FD LDs #1 and #2 is referred to as the "mutual injection". That is, when the output port of the FP LD #1 is coupled to that of the FP LD #2, photons oscillated and output from the FP LP #1 are injected into a cavity of the FP LP #2. Similarly, the output of the FP LD #2 is injected into the FP LD #1.

The "mutual injection" can be implemented by making use of the 50:50 CPL. The 50:50 CPL can obtain output light by separating a mutually injected output as well as can couple the FP LDs #1 and #2 to each other. For example, the 50:50 CPL can use a 2×2 or 1×2 optical coupler that has one or two output ports capable of extracting an output.

The isolators #1 and #2 prevent output light from being reflected and input into the FP LDs #1 and #2.

When the FP LDs #1 and #2 are directly connected to each other without making of use an optical coupler, optical outputs of other mirrors rather than mirrors positioned in a direction for connecting the FP LDs #1 and #2 to each other can be used as output light.

A wavelength interval between oscillation modes in the FP LD is determined by the length of a cavity. That is, because wavelengths oscillate while consecutively traveling in the right and left directions of the cavity of the FP LD, an interval between the oscillating wavelengths is narrow when the cavity length is long.

When a bias current of the FP LD is increased, a refractive index of the FF LD is reduced due to increased carrier density, and an oscillating wavelength is reduced.

Further, when a temperature of the FP LD is varied, a refractive index of the LD is varied and hence an oscillating wavelength is varied.

Figure 2:
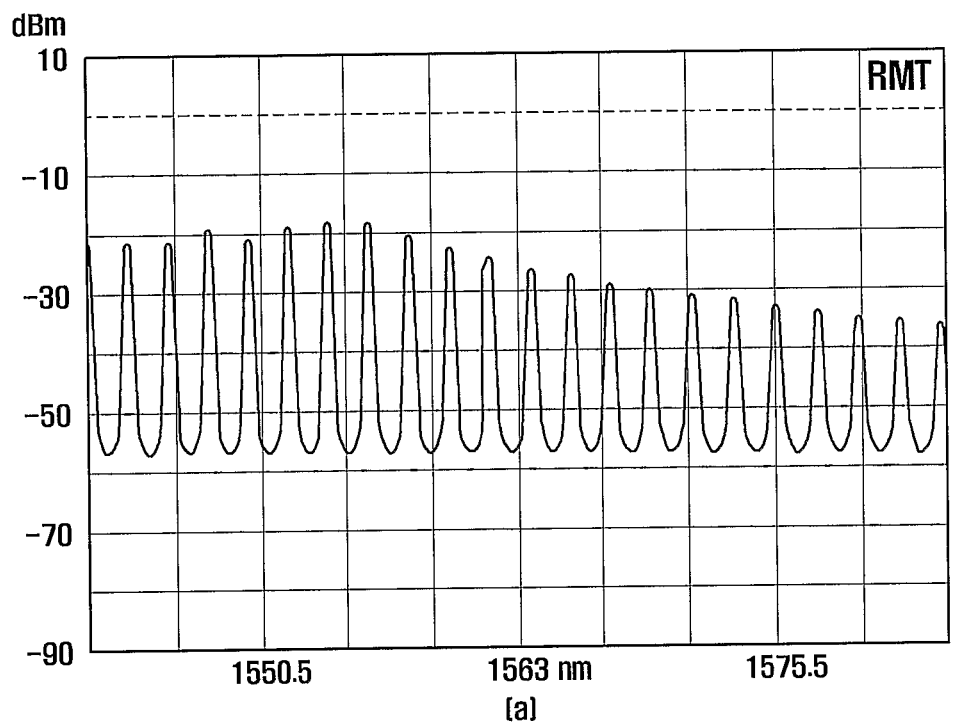
FIG. 2 illustrates the spectrums of FP LDs #1 and #2 of FIG. 1 before mutual injection.
Figure 2:
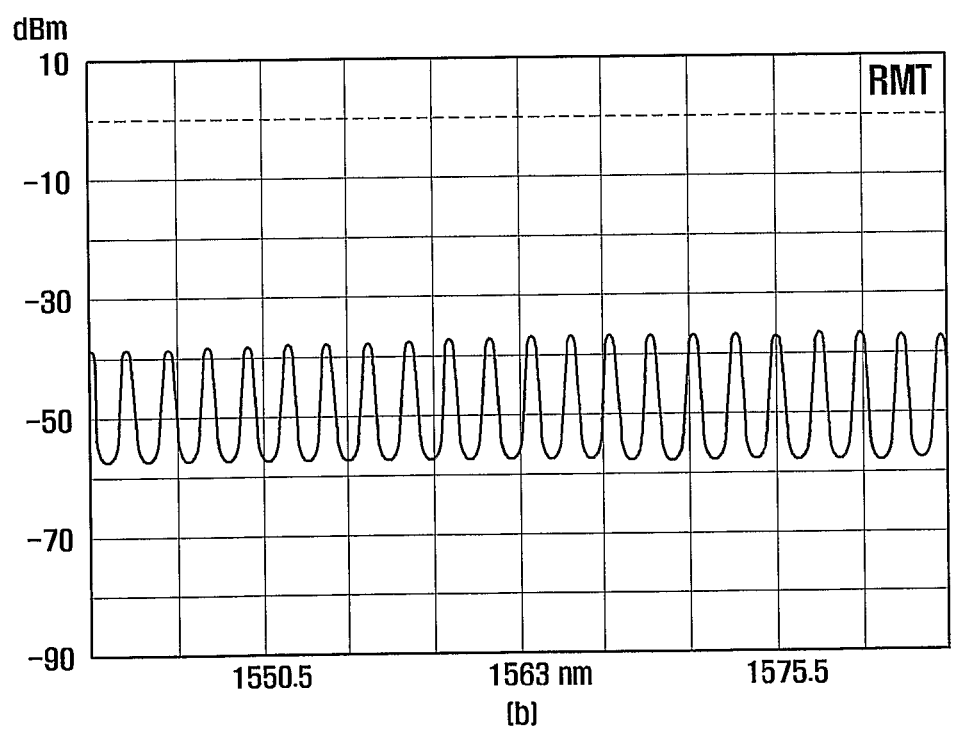

Accordingly, a wavelength of oscillating mode can be adjusted by varying a bias current and temperature of each of the FP LDs #1 and #2. FIGS. 2(a) and 2(b) illustrate independent spectrums of the FP LDs #1 and #2.

Figure 3:
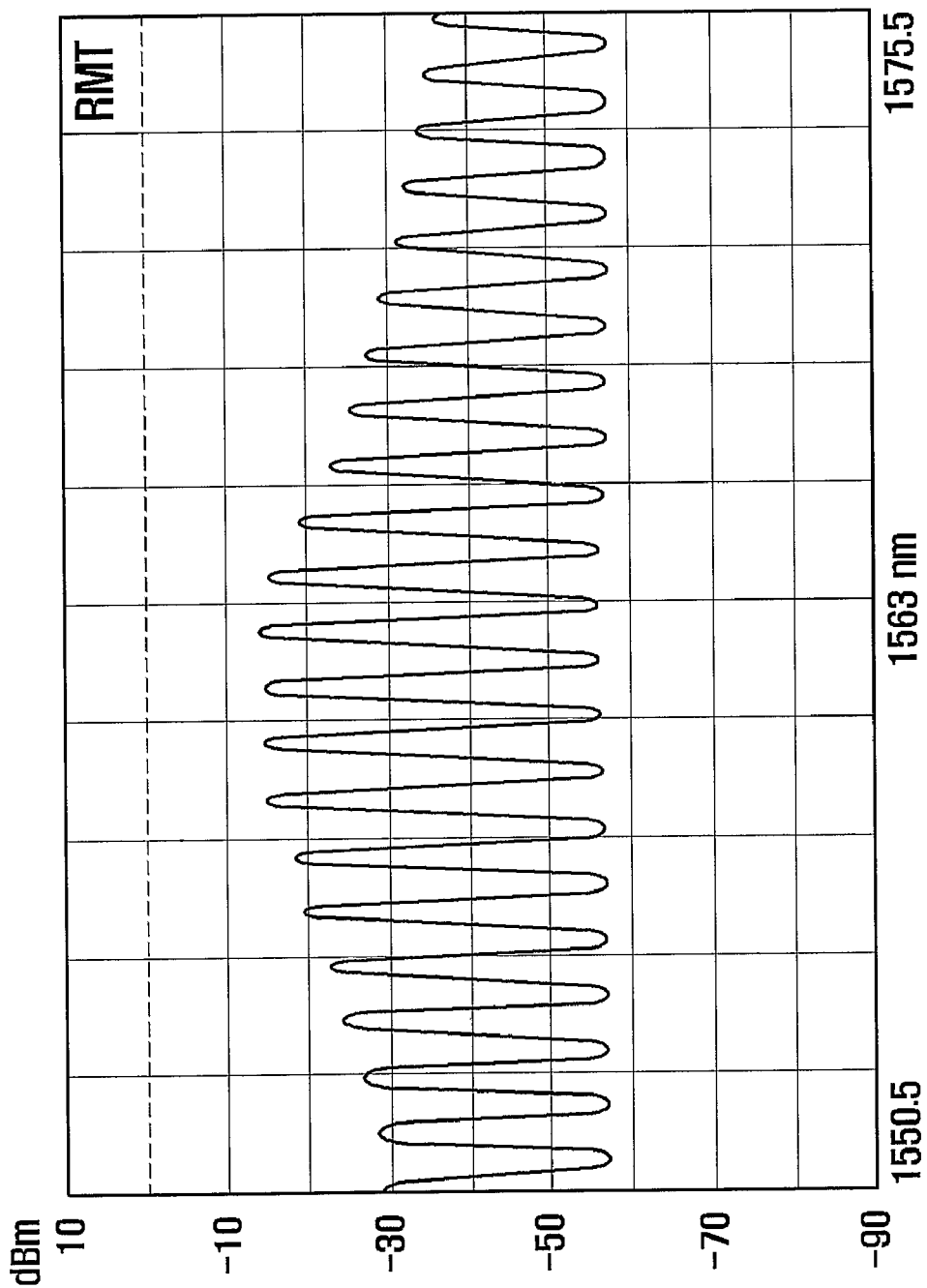
FIG. 3 illustrates the spectrum of an FP LD of FIG. 1 after mutual injection.
Figure 4:
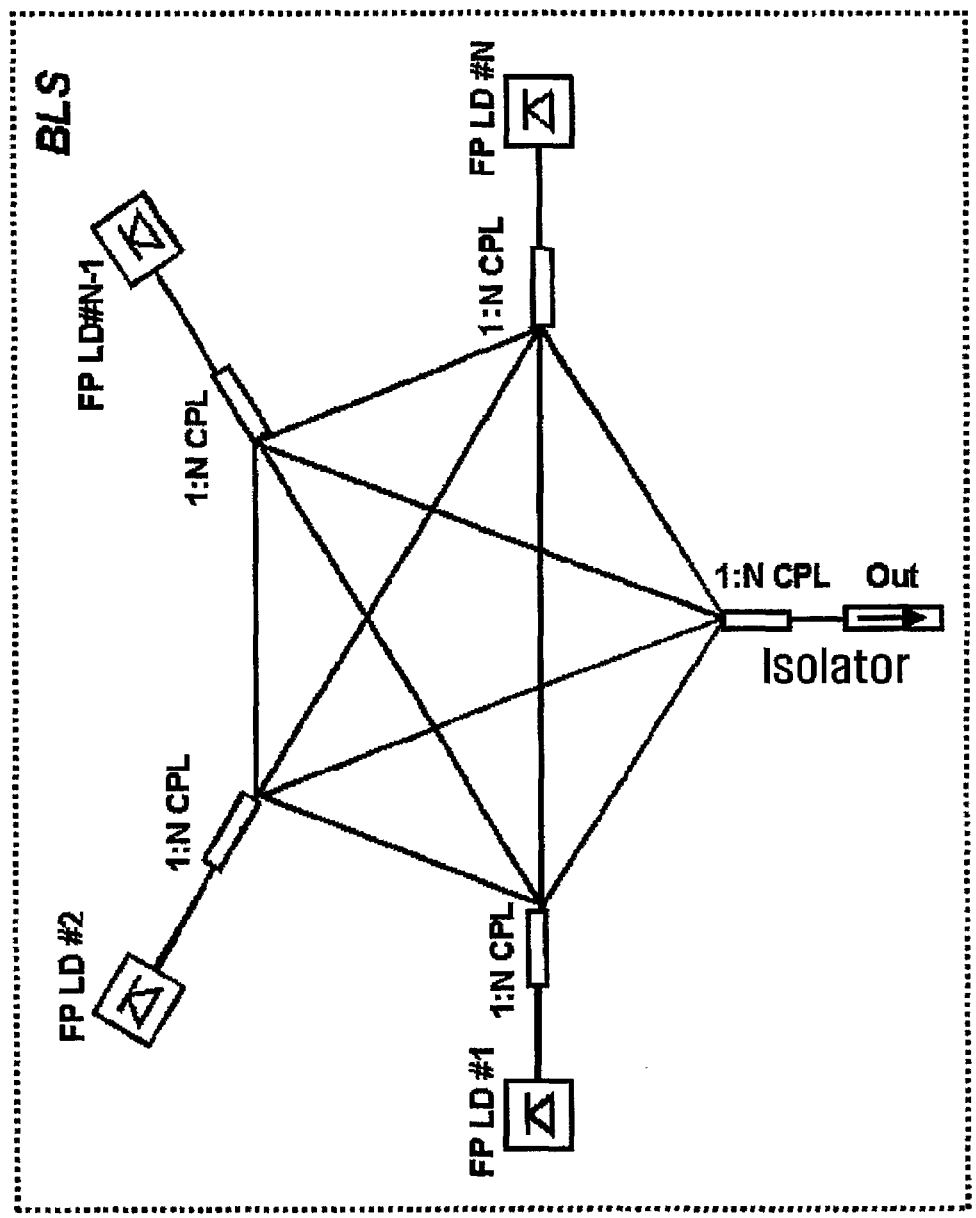
FIGS. 4 to 7 illustrate BLSs using mutual injection of N number of FP LDs.
Figure 5:
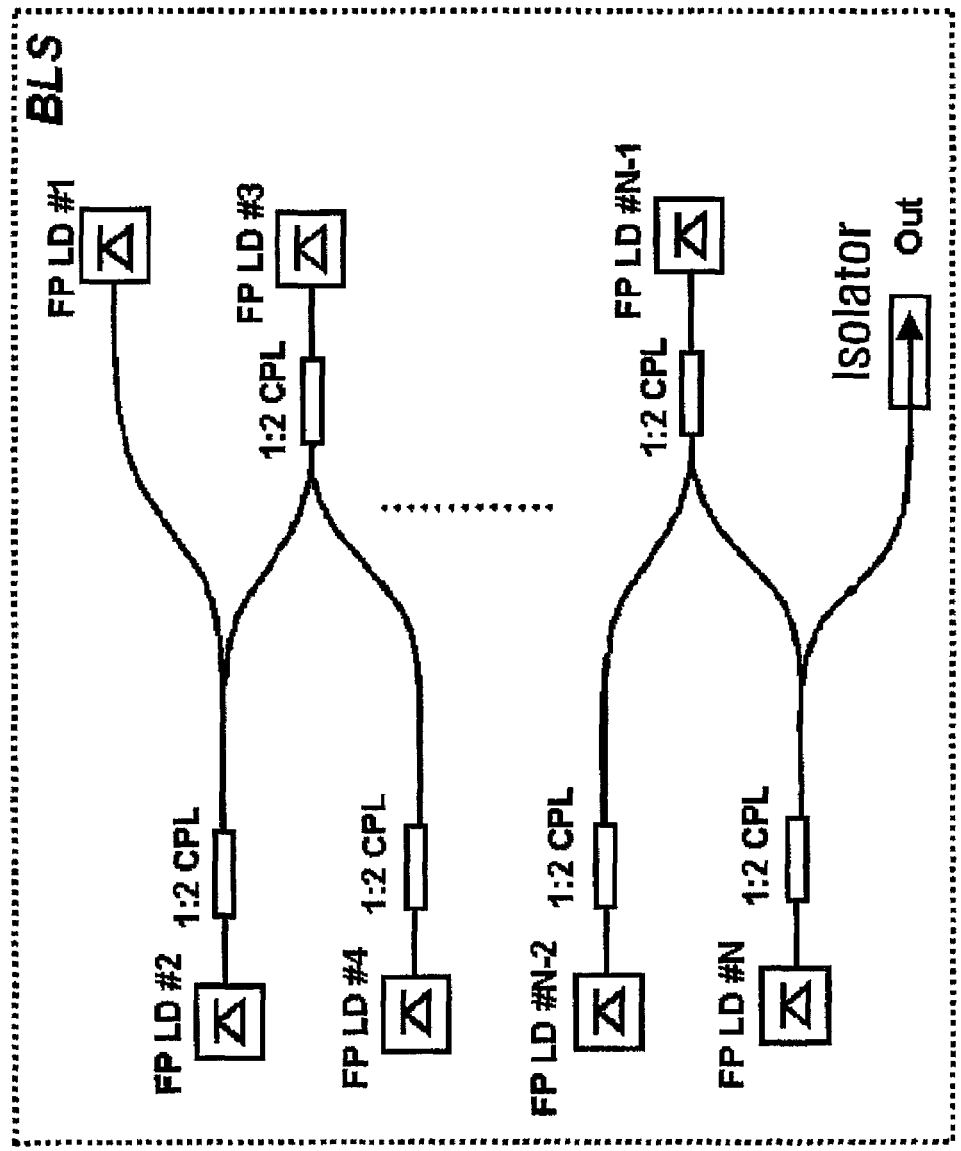
Figure 6:
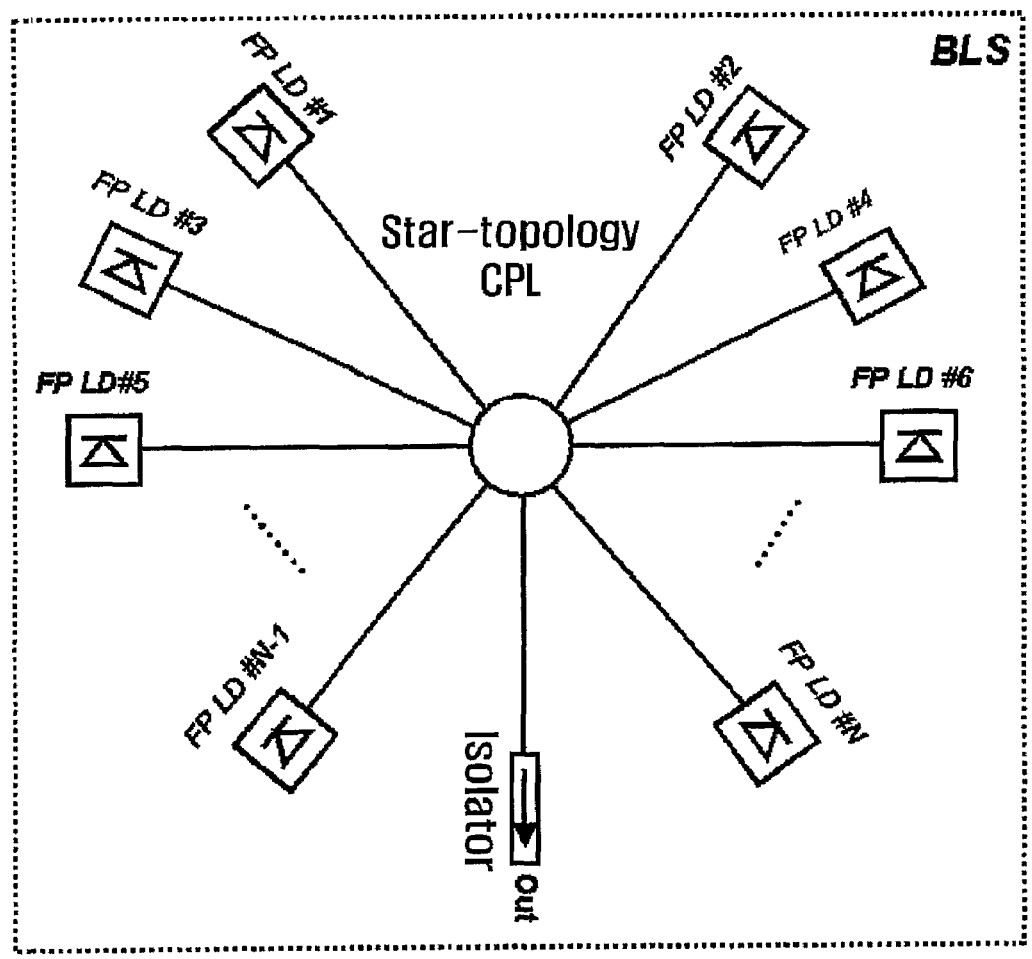
Figure 7:
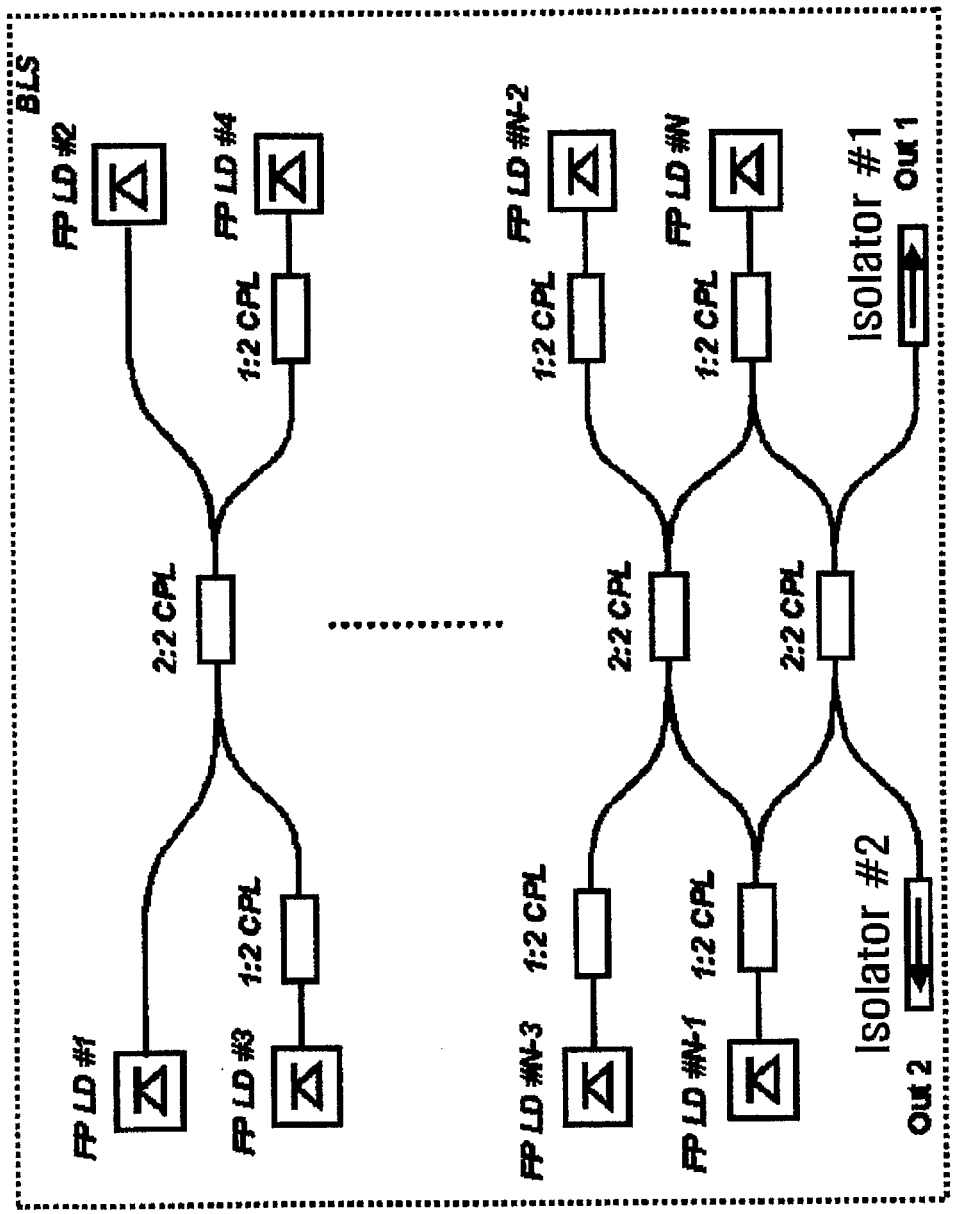

FIG. 3 illustrates an output generated through mutual injection after an oscillating wavelength is adjusted by varying a bias current and operating temperature of the FP LDs #1 and #2 of FIG. 1.

As illustrated in FIG. 3, it can be seen that the output generated through the mutual injection has a broadened oscillating bandwidth as compared with the spectrum oscillating from an independent FP LD before the mutual injection. That is, a bandwidth of 3 dB in one mode of the FP LD before the mutual injection is 0.1 nm (limited by a measurer's resolution). After the mutual injection, the bandwidth increases to approximately 0.3 nm. Because a spectrum in which the oscillating bandwidth has been broadened has very low coherence, it can be used in the BLS.

Characteristics of a multimode light source with a broad incoherent line width illustrated in FIG. 3 will now be described.

Mode partition noise is reduced in one mode of the FP LD by the "mutual injection". Generally, one mode of the FP LD capable of oscillating in the multimode has the mode partition noise. That is, because the number of photons contributing for oscillation in one mode is not constantly maintained but varies with time, noise occurs.

When outputs of the FP LDs #1 and #2 are coupled by the 50:50 coupler, and a mutual injection channel is generated, photons oscillating in the same wavelength mode are bi-directionally injected. Even when the number of photons contributing for oscillation in one mode of the FP LD #1 is reduced, the mode partition noise is reduced because the FP LD #2 compensates photons. Accordingly, when the number of FP LDs used for the mutual injection increases, the mode partition noise can be reduced. That is, N number of FP LDs can be used as an increased number of FP LDs.

FIGS. 4, 5, 6, and 7 illustrate BLSs with the N FP LDs using the effect of mutual injection. FIGS. 4, 5, 6, and 7 use 1:N couplers, 1:2 couplers, an N:N couplers with a star topology, and 1:2 and 2:2 couplers, respectively. After a plurality of lasers of the N FD LDs are modulated and oscillation line-widths thereof are increased, photons of the N FP LDs with the increased line-widths can be mutually injected.

The FD LDs can use antireflection-coated lasers to increase the mutual injection effect. More specifically, a band of an incoherent light source can be increased using a broadband FP LD.

A spectrum obtained from the mutual injection is generated while photons periodically run between the FP LDs #1 and #2. The spectrum is a result obtained by periodically repeating a process for generating an output "Out 1" from the 50:50 coupler when photons from the FP LD #1 are injected into the FP LD #2 and then return to the FP LD #1. Accordingly, the noise effect depends upon the length between the FP LDs #1 and #2.

When the length between the FP LDs #1 and #2 is short, a periodic frequency interval of noise is wide and hence a transmission bit rate is increased. For example, when the length between the FP LDs #1 and #2 is 50 cm, a periodic frequency interval of noise is 200 MHz, and hence a transmission bit rate is limited to within 200 Mbps. Accordingly, as an interval between the FP LDs #1 and #2 is narrow, a bit rate can be increased.

An output of the BLS is filtered according to a desired wavelength such that the FP LD wavelength-locked to incoherent light injected can be implemented. The filtered light must be injected into the FP LD oscillating in the multimode. The spectrum of FIG. 3 obtained from a proposed structure of the present invention can be used for the BLS in each mode. That is, a desired mode wavelength can be filtered and used.

However, when an oscillation mode interval of the mutually injected laser is narrow, multimode filtering is performed and filtered light is injected into FP LDs, such that the FP LDs wavelength-locked to injected incoherent light can be implemented.

Figure 8:
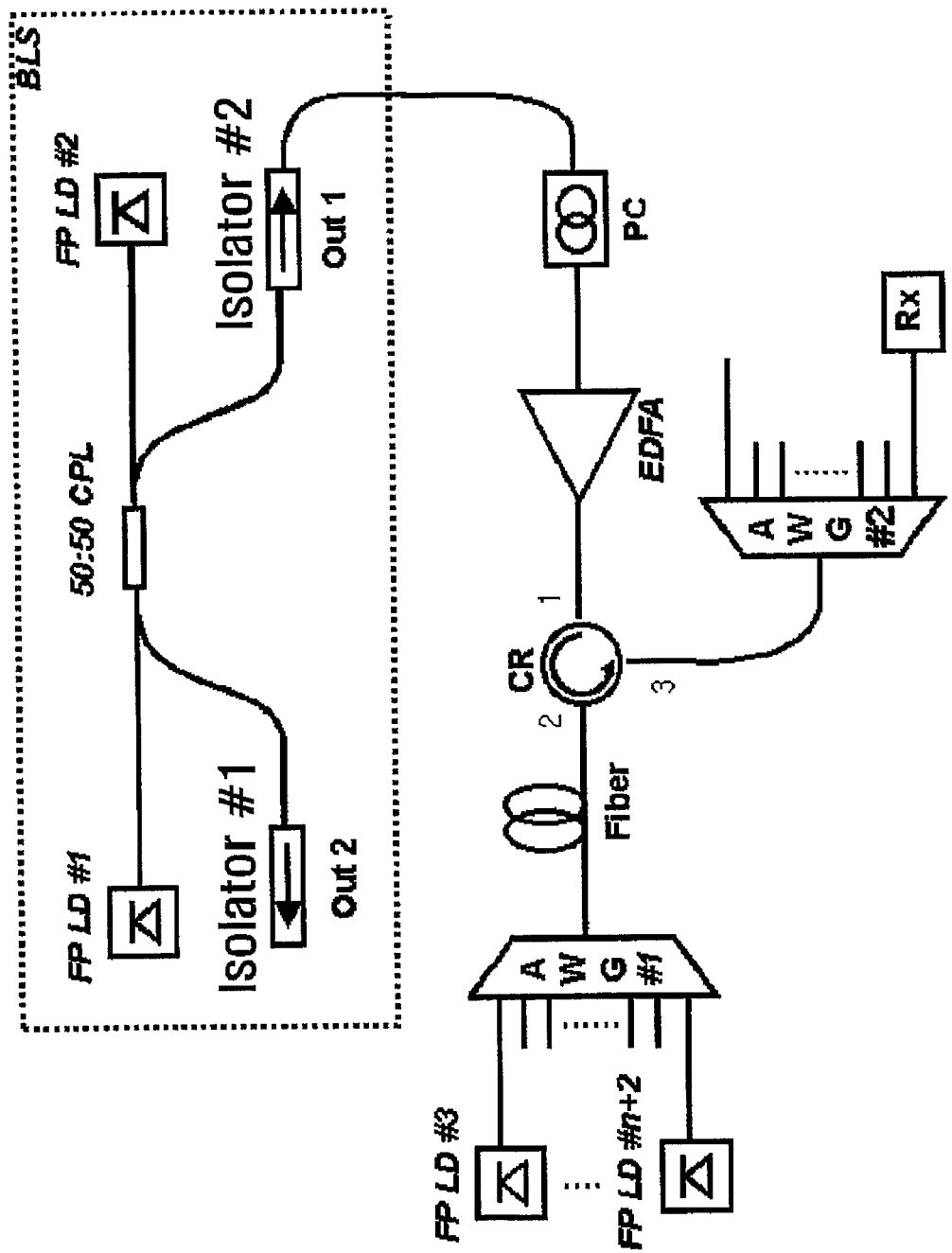
FIG. 8 illustrates an experimental configuration using the BLS in accordance with the first embodiment of FIG. 1.

FIG. 8 illustrates an optical transmitter using a light source for wavelength-locking n FP LDs including the FP LD #3 after filtering, through an arrayed waveguide grating (AWG), light in one mode of the BLS obtained from the structure of FIG. 1. The optical transmitter includes a BLS using mutual injection of FP LDs #1 and #2, an AWG #1 for filtering light into n number of light components in a plurality of oscillation modes of the BLS (where n is the number of output ports of the AWG #1 or the number of wavelength division multiplexing (WDM) signal channels), an optical fiber for transmission, n number of third FP LDs #3, . . . , #n+2 for outputting light wavelength-locked to a light wavelength injected through the AWG #1, an optical circulator (CR) for outputting light input through the AWG #1, and an AWG #2 for demultiplexing a WDM signal into n number of signals.

When power of broadband incoherent light obtained by the BLS proposed in FIG. 1 is insufficient to lock the wavelengths of the n FP LDs #3, . . . , #n+2, an erbium doped fiber amplifier (EDFA) can be used.

Alternatively, a bias current of the FP LDs #1 and #2 can be varied, or a high-power FP LD can be used, to produce desired power.

The broadband incoherent light in the multimode with sufficient power is output from Port 2 of the CR and is filtered in one mode through the AWG #1. This mode performs wavelength-locking for the n FP LDs #3, . . . , #n+2. Here, antireflection-coated FP LDs can be used to increase the efficiency of injection of the incoherent light source into cavities of the n FP LDs #3, , #n+2.

A polarization controller (PC) is required such that polarized light of the n FP LDs #3, . . . , #n+2 is adjusted to injected polarized light of the BLS. In this case, the BLS using mutual injection of the FP LDs serves as a polarized BLS. An unpolarized BLS can be constructed using the structure proposed in FIG. 19 or 20. That is, when an example of the structure of FIG. 19 is used in the structure of FIG. 4, 5, or 6 in which the number of output ports of the BLS is one, the unpolarized BLS can be implemented.

Figure 19:
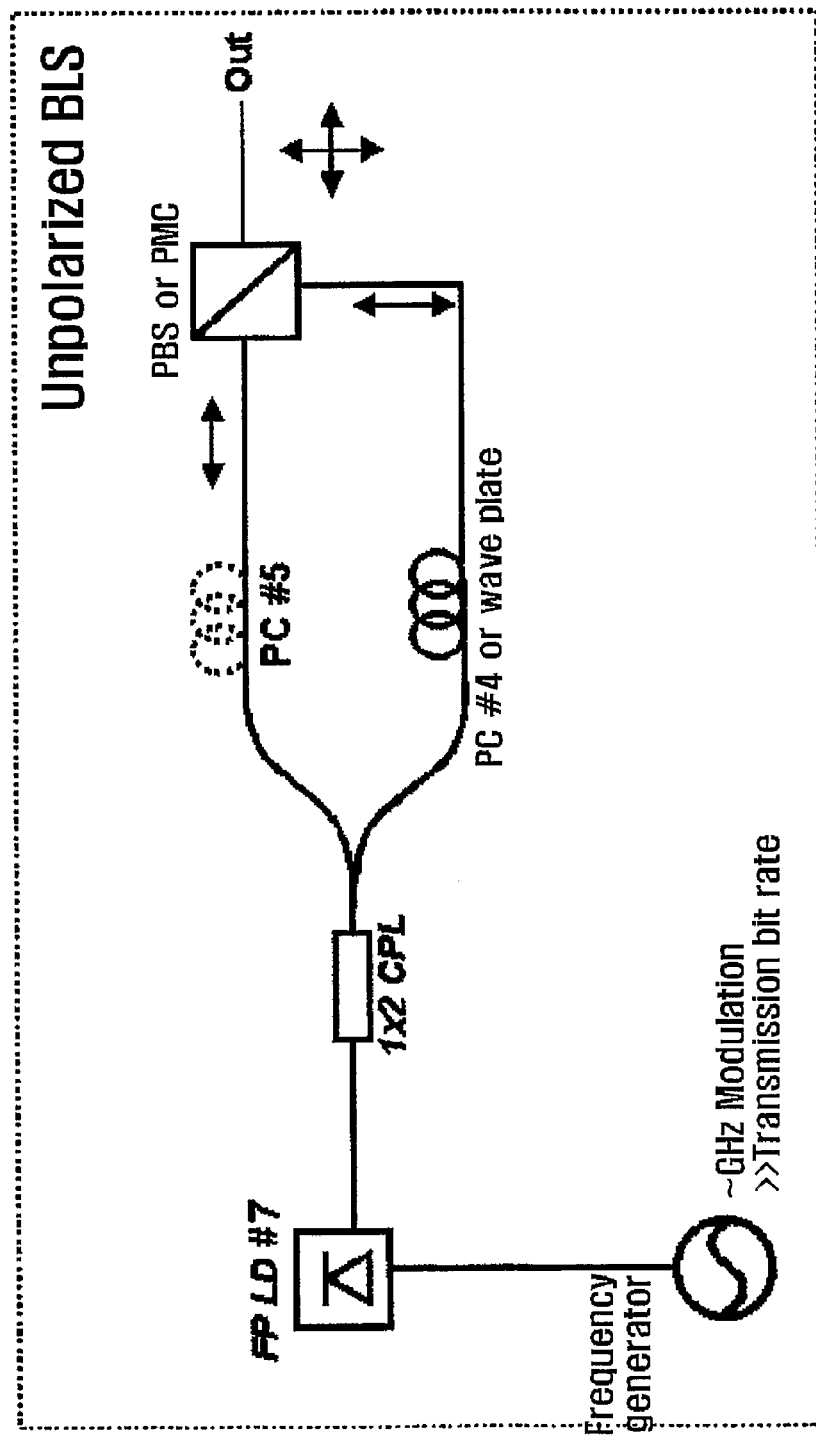
FIG. 19 illustrates a polarization multiplexer for implementing an unpolarized BLS when the number of output ports of a polarized BLS is one.
Figure 20:
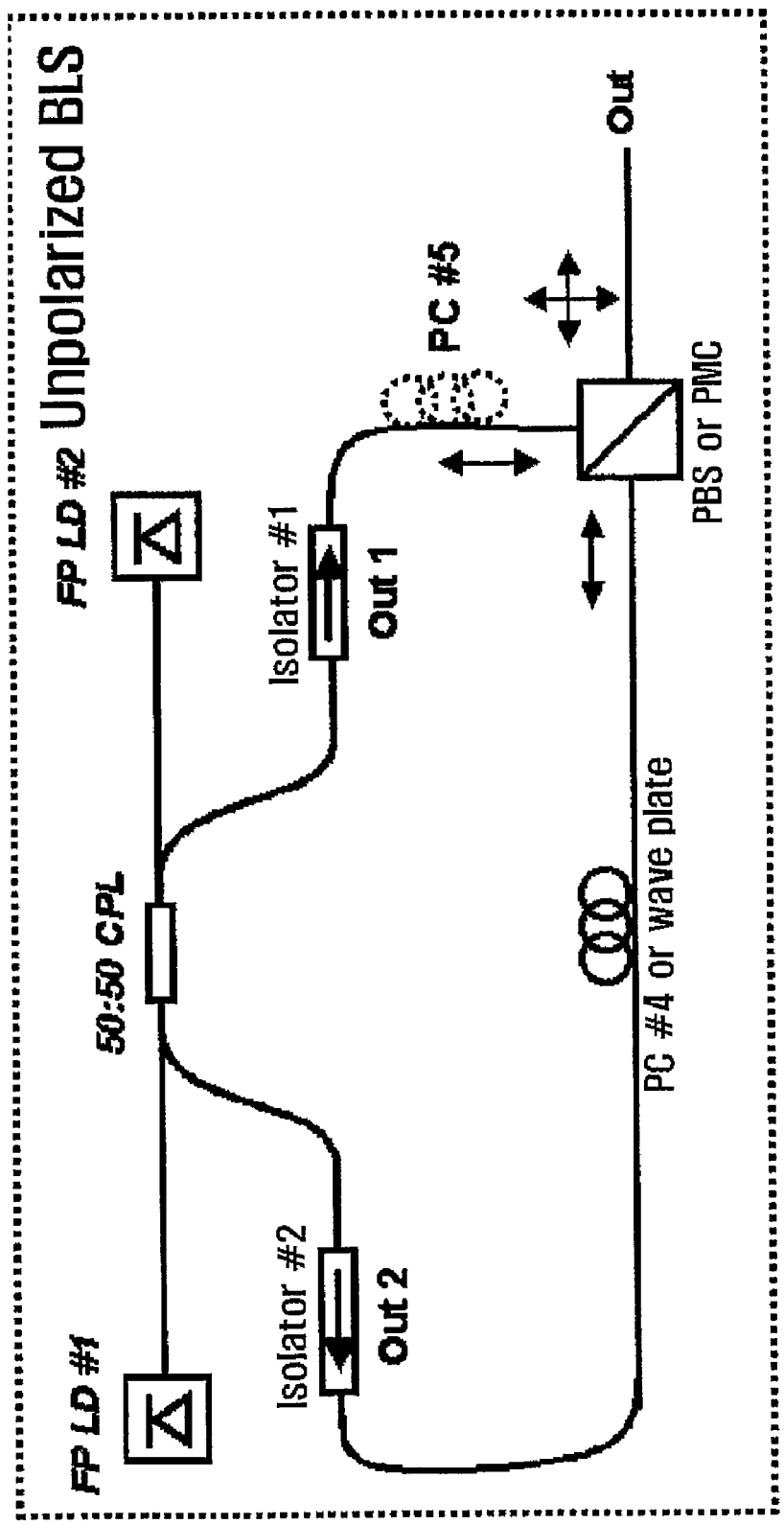
FIG. 20 illustrates a polarization multiplexer for implementing an unpolarized BLS when the number of output ports of a polarized BLS is two.

FIG. 19 illustrates an example of an unpolarized BLS. Referring to FIG. 19, the unpolarized BLS includes a 1×2 coupler (CPL) for separating broadband incoherent light, polarization controllers (PC) #4 and #5 for generating horizontally and vertically polarized light components from the separated light, and a polarization beam splitter (PBS). Alternatively, the unpolarized BLS includes a 1×2 coupler (CPL) for separating broadband incoherent light into two light components, a wave plate for adjusting one light component such that it can be vertical to the other light component or at least one polarization controller for adjusting polarized light components such that they are vertical to each other, and a polarization maintaining coupler (PMC). When the structure of FIG. 1, 7, or 8 in which the number of output ports of the BLS is two is applied to that of FIG. 20, an unpolarized BLS can be implemented. FIG. 20 illustrates a structure in which a 1×2 coupler (CPL) used in FIG. 19 is not necessary. A description of the method for implementing the unpolarized BLS in FIG. 20 is the same as that of FIG. 19.

Figure 9:
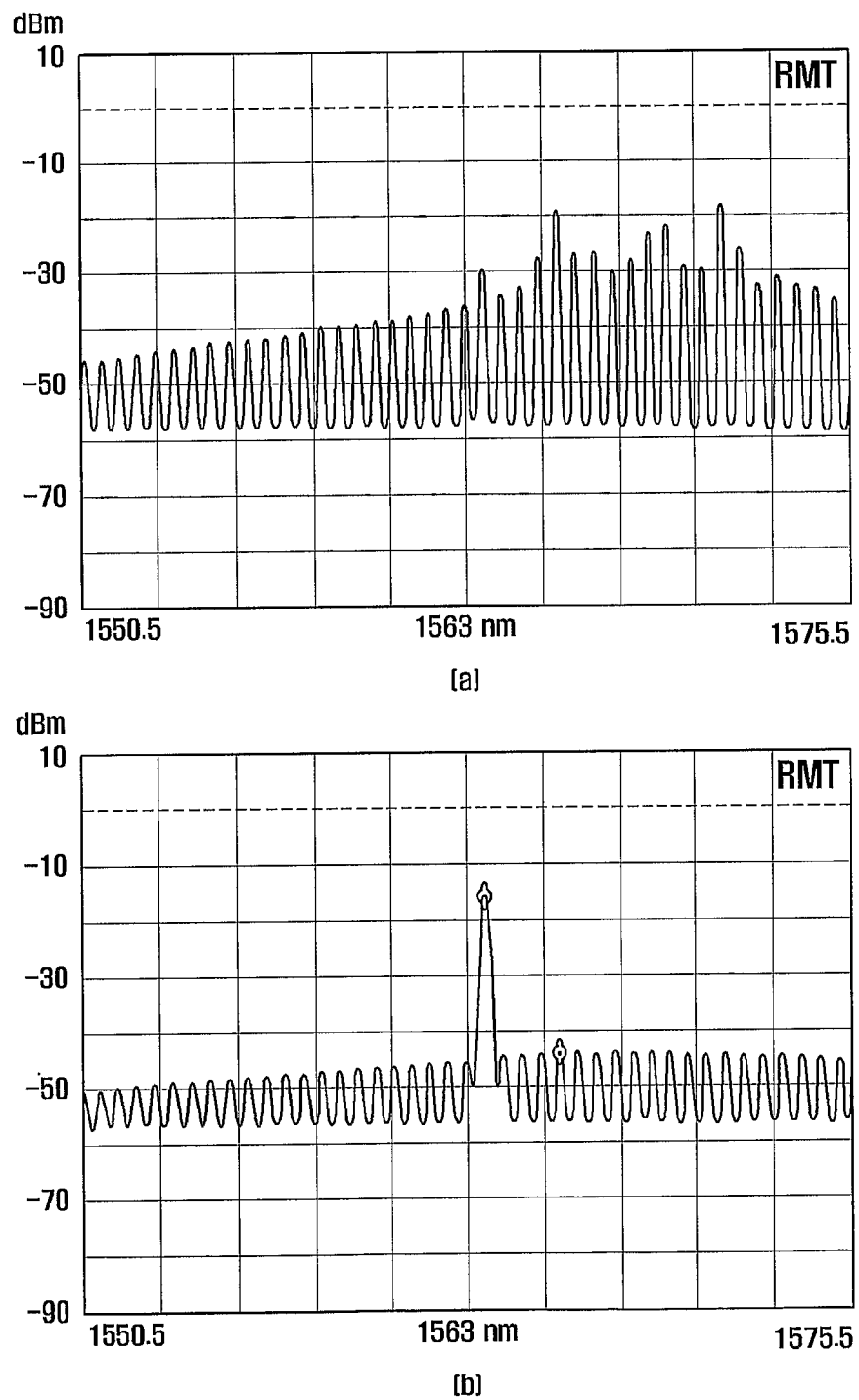
FIG. 9 illustrates the relationship between spectrums of an FP LD #3 of FIG. 8 after and before wavelength locking.

It can be seen from FIG. 9 that a side-mode suppression ratio (SMSR) of the FP LD wavelength-locked according to the structure of FIG. 8 has been significantly improved as compared with an SMSR of the FP LD before wavelength locking. Accordingly, an output extracted from Port 3 of the CR through the AWG #2 after directly modulating the wavelength-locked FP LD described above is appropriate to be used as wavelength division multiplexing-passive optical network (WDM-PON) light filtered in side mode.

Figure 10:
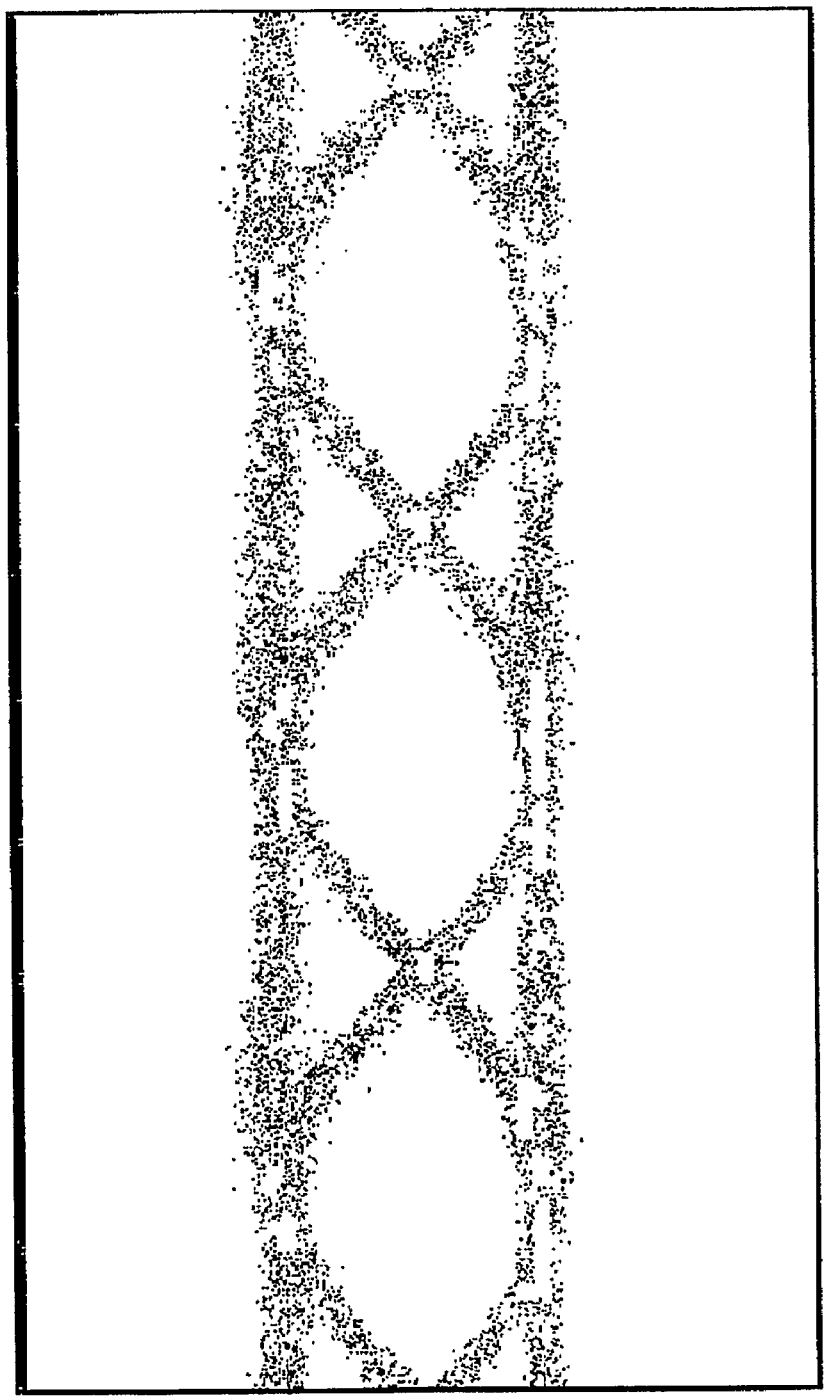
FIG. 10 is an eye diagram illustrating a result of experimentation of FIG. 8.

FIG. 10 illustrates an eye diagram when the FP LD wavelength-locked to broadband incoherent light obtained by mutual injection between the FP LDs #1 and #2 is modulated at 155 Mbps.

Figure 11:
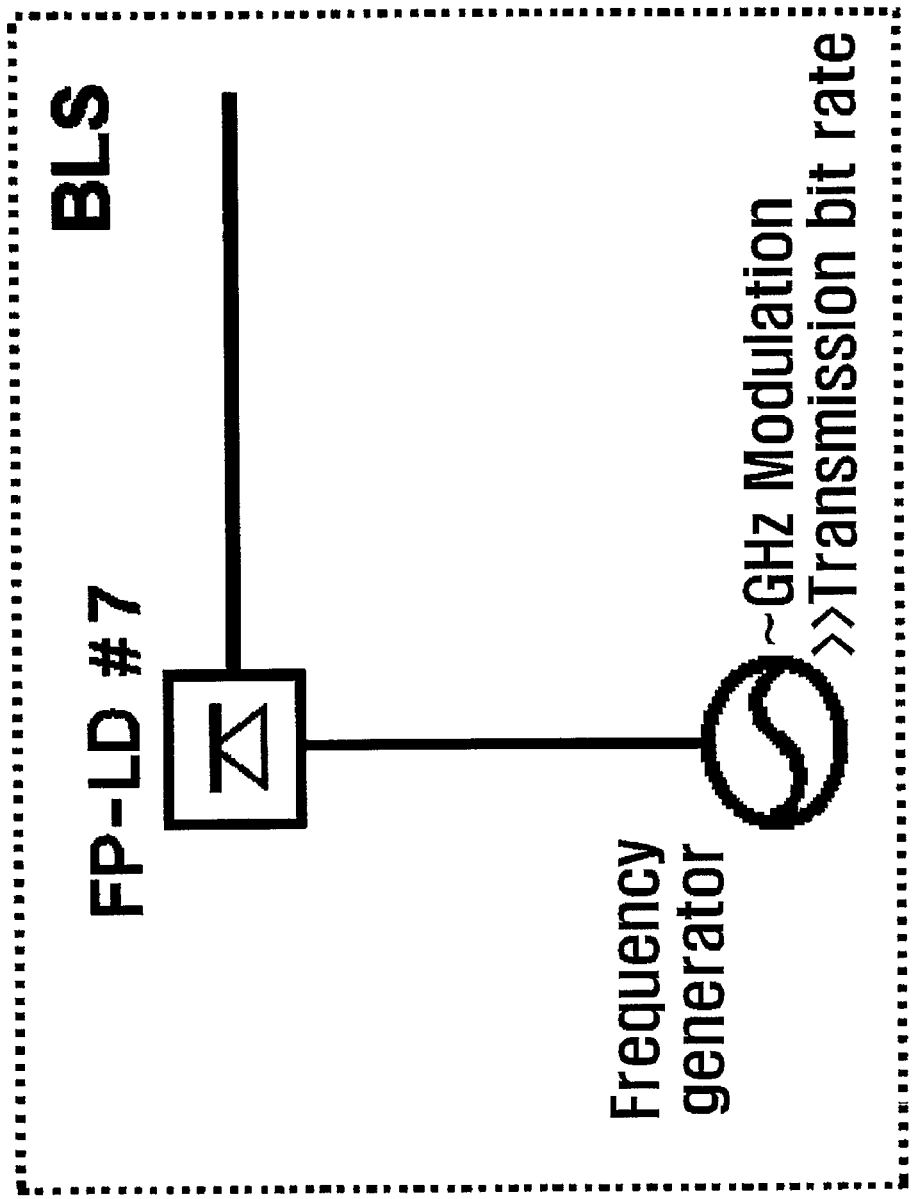
FIG. 11 illustrates a BLS using chirping of an FP LD in accordance with a second embodiment of the present invention.

FIG. 11 illustrates a BLS using chirping of an FP LD in accordance with a second embodiment of the present invention. The BLS includes an FP LD #7 for generating multimode light, and a frequency generator for inducing chirping of the FP LD #7.

When the FP LD #7 is directly modulated at a higher frequency than that of a desired transmission rate, the FP LD #7 undergoes chirping.

Figure 12:
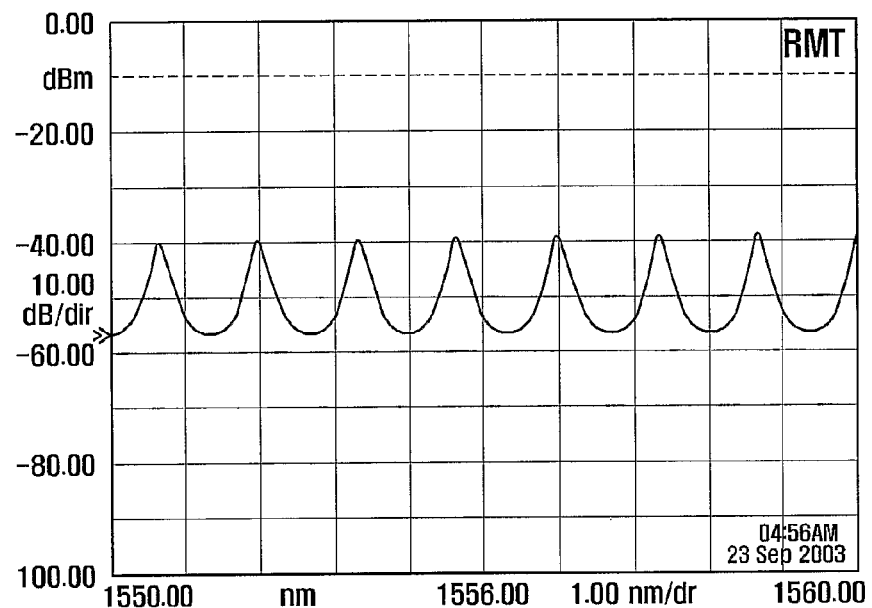
FIG. 12 illustrates the relationship between spectrums of an FP LD #7 using chirping.
Figure 12:
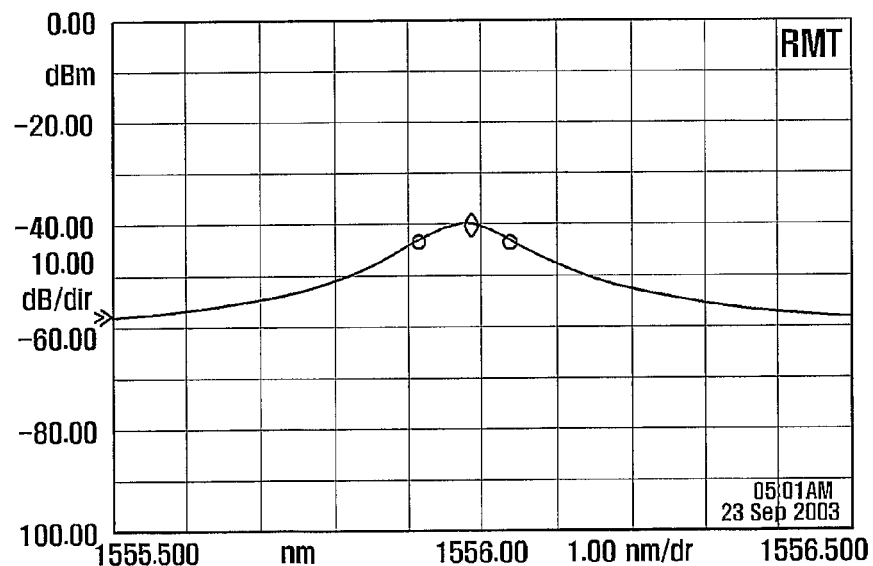
Figure 13:
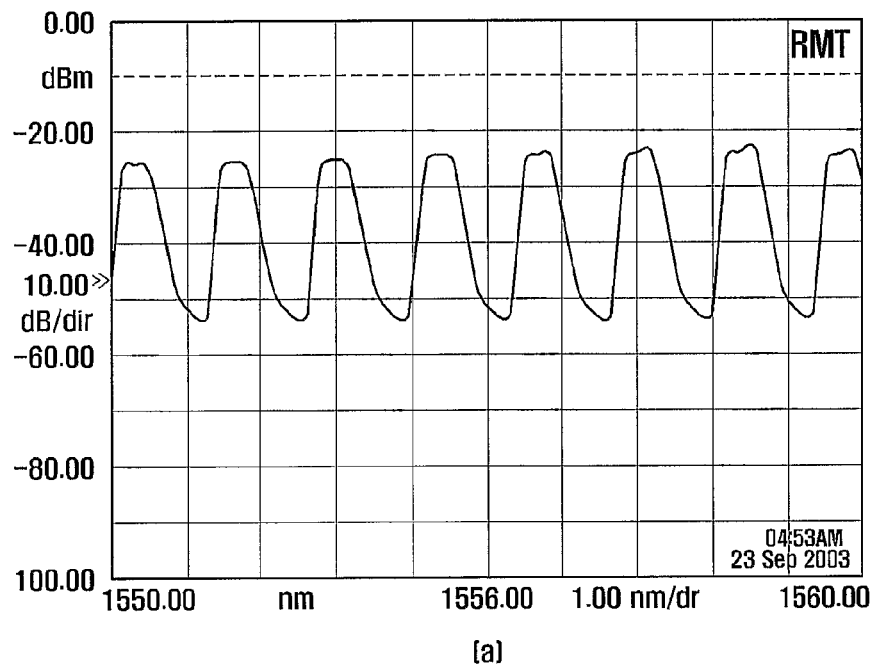
FIG. 13 illustrates the relationship between spectrums of the FP LD #7 undergoing chirping.
Figure 13:
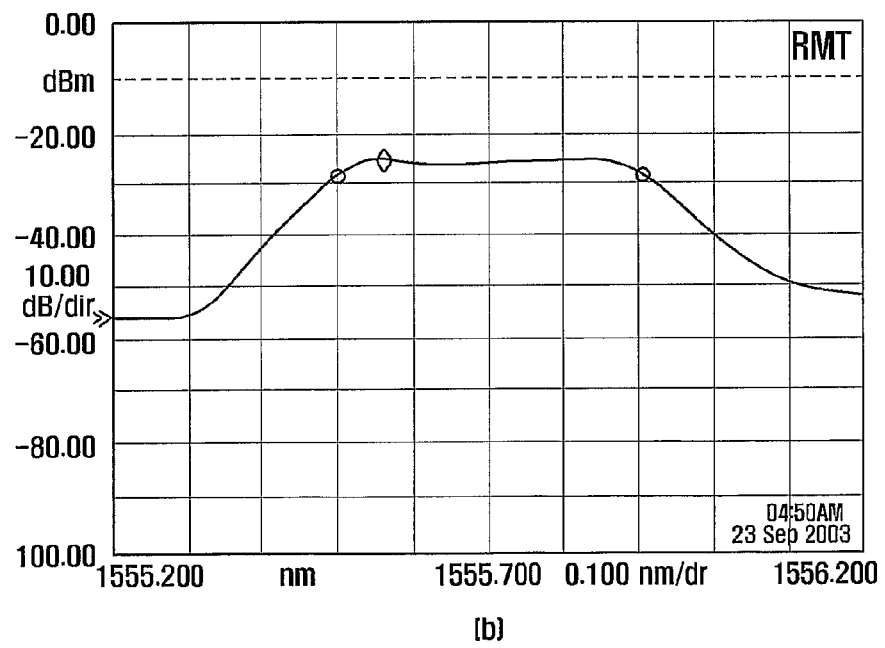

FIGS. 12 and 13 illustrate a comparison of spectrums before and after the direct modulation when the FP LD #7 operates at a threshold current. A bandwidth of 3 dB in one mode according to the direct modulation is 0.4 nm, and characteristics of incoherence of a laser are lost.

Carrier density, a refractive index, and an optical signal frequency within a cavity of the FP LD #7 are modulated when the FP LD #7 is directly modulated. A spectrum after the direct modulation is broadened as compared with a mode-by-mode spectrum of the FP LD before the direct modulation. When the broadened spectrum is filtered in one mode, the filtered broadened spectrum is used as incoherent light. In this case, because not only a spectrum in specific mode is broadened, but also spectrums in other modes of the FP LD #7 are broadened as illustrated in FIG. 13(a), filtered broadened spectrums in all modes can be used as incoherent light. FIG. 13(b) illustrates a result of filtering a broadened spectrum in one mode.

When a temperature of the FP LD is varied, its refractive index is varied and thus an oscillating wavelength is varied.

When a bias current and a temperature of a selected FP LD are varied and an oscillating mode wavelength is varied, an oscillating wavelength of the FP LD #7 can be adjusted. The second embodiment of the present invention can adjust the oscillating wavelength by varying the temperature of the FP LD #7 using a heater (not shown).

Figure 14:
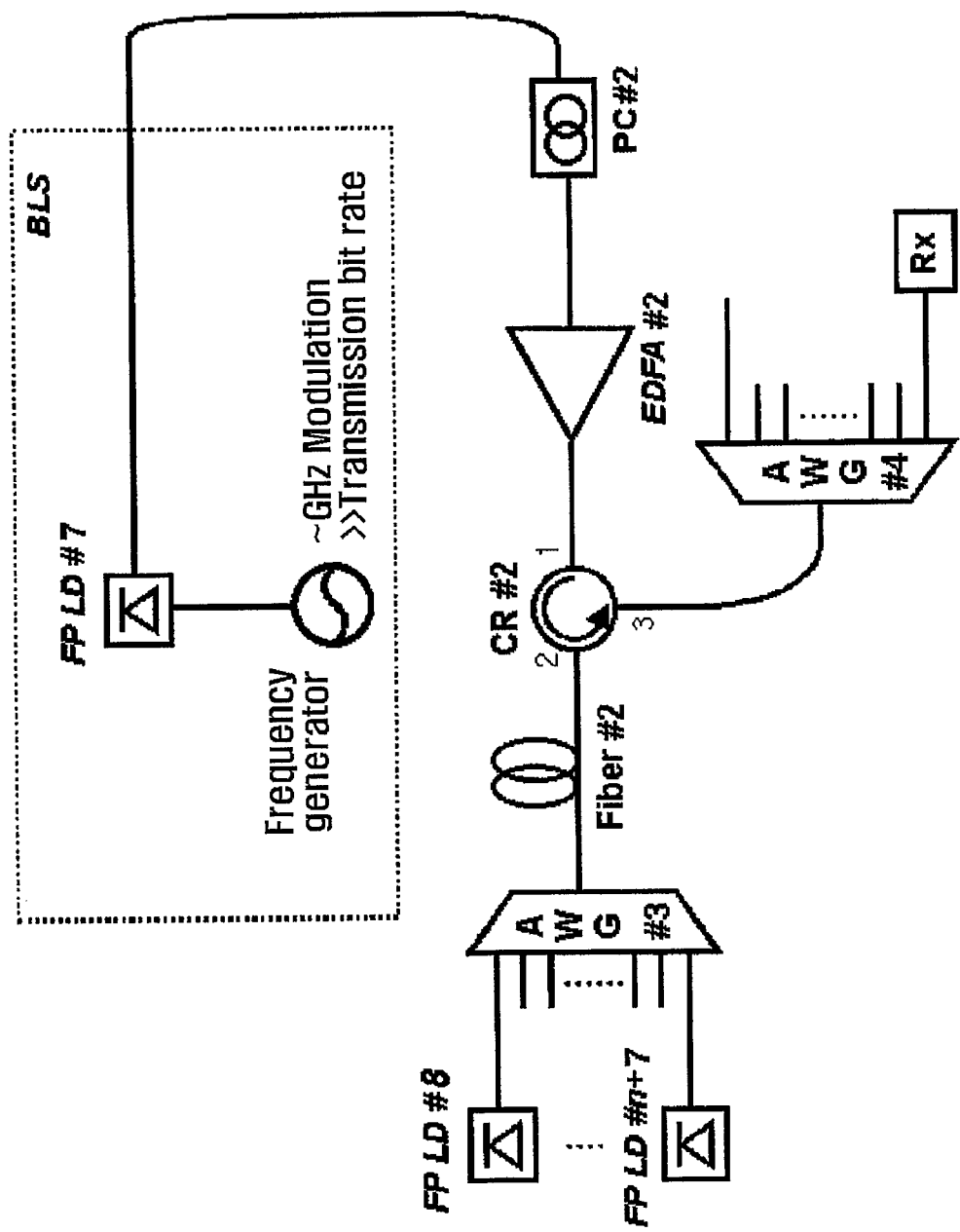
FIG. 14 illustrates an experimental configuration using the BLS in accordance with the second embodiment of FIG. 11.

FIG. 14 illustrates an experimental configuration using the BLS in accordance with the second embodiment of FIG. 11. The experimental configuration includes a BLS including an FP LD #7 for generating multimode light and a frequency generator for inducing chirping of the FP LD #7, an AWG #3 for filtering light into n number of light components in a plurality of oscillation modes of the BLS (where n is the number of output ports of the AWG #3 or the number of WDM signal channels), an optical fiber for transmission, n number of FP LDs #8, . . . , #n+7 for outputting light wavelength-locked to a light wavelength injected through the AWG #3, a CR #2 for outputting light input through the AWG #3, and an AWG #4 for demultiplexing a WDM signal into n number of signals.

When power of broadband incoherent light obtained by the BLS proposed in FIG. 11 is insufficient to lock wavelengths of the n FP LDs, an EDFA can be used. A spectrum broadened by chirping in FIG. 11 is filtered mode by mode, mutual injection of the n FP LDs including the FP LD #8 is performed, direct modulation is performed, and a result of the direct modulation is transmitted.

The n FP LDs can be wavelength-locked at low injection power when serving as antireflection-coated FP LDs. Adjustment of a PC #2 is required to adjust polarized light of the n FP LDs to injected polarized light of an incoherent light source. The PC #2 is necessary because the BLS using chirping of the FP LD is a polarized BLS with specific polarized light. More specifically, an unpolarized BLS can be implemented using the example illustrated in FIG. 19.

A receiving side receives wavelength-locked signals of the n FP LDs through an optical fiber #2 and the CR #2.

Figure 15:
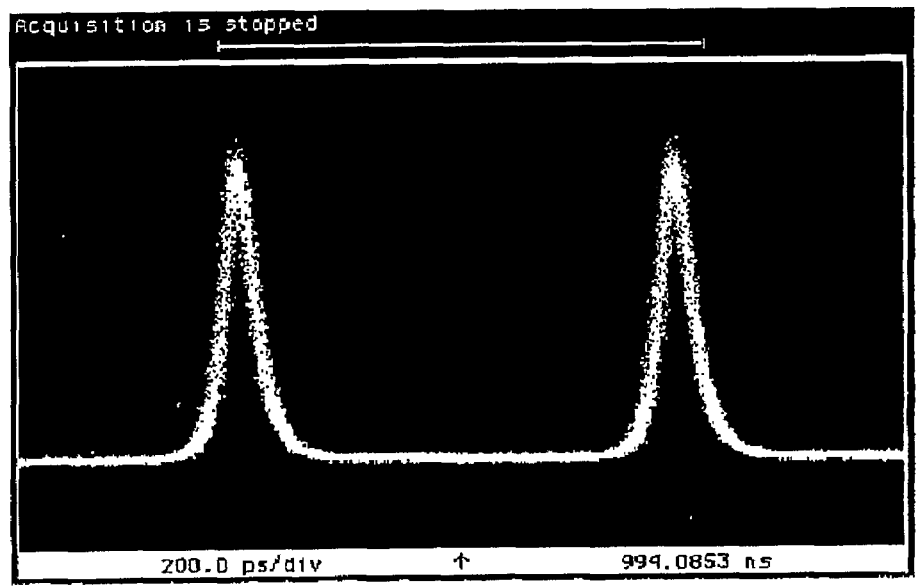
FIG. 15 illustrates the relationship between multimode and single-mode pulses of the FD LD #7 undergoing chirping.
Figure 15:
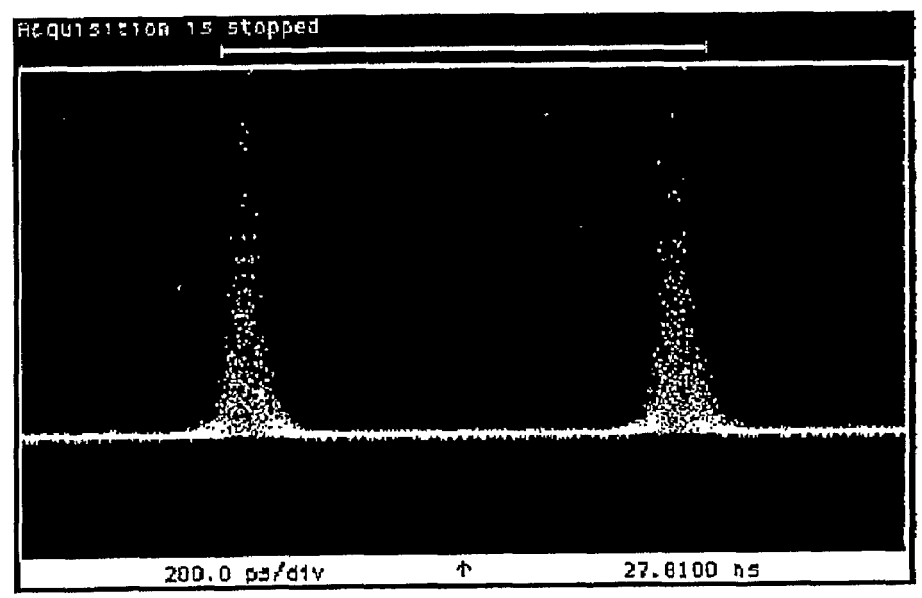

The FP LD #7 undergoing chirping in the BLS generates pulses with a cycle corresponding to a reciprocal of a directly modulated frequency. FIGS. 15(a) and 15(b) illustrate a pulse shape of multimode and a pulse shape of one mode in the FP LD #7 undergoing chirping when the FP LD #7 is modulated at a sinusoidal wave of 1 GHz and a pulse cycle is 100 ps, respectively.

It can be seen from FIG. 15(b) that pulse components are scattered because of mode partition noise when only one mode filtering of the FP LD #7 undergoing chirping is performed. A method for reducing the mode partition noise must be used when the n FP LDs are locked to a wavelength of one mode going through an AWG. An example of reducing the mode partition noise is illustrated in FIGS. 17 and 18.

Figure 16:
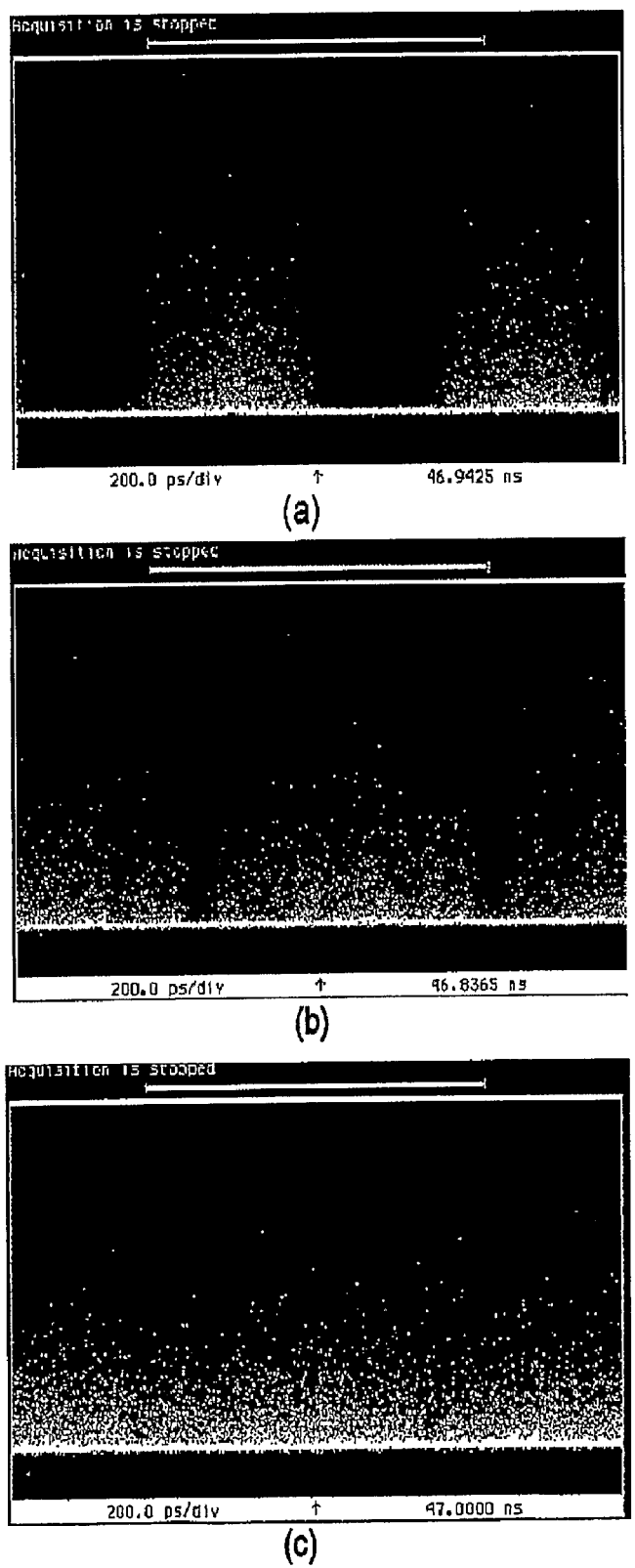
FIG. 16 illustrates the relationship between pulses according to fiber lengths when the spectrum of the FD LD #7 undergoing chirping goes through an optical fiber in one mode.
Figure 17:
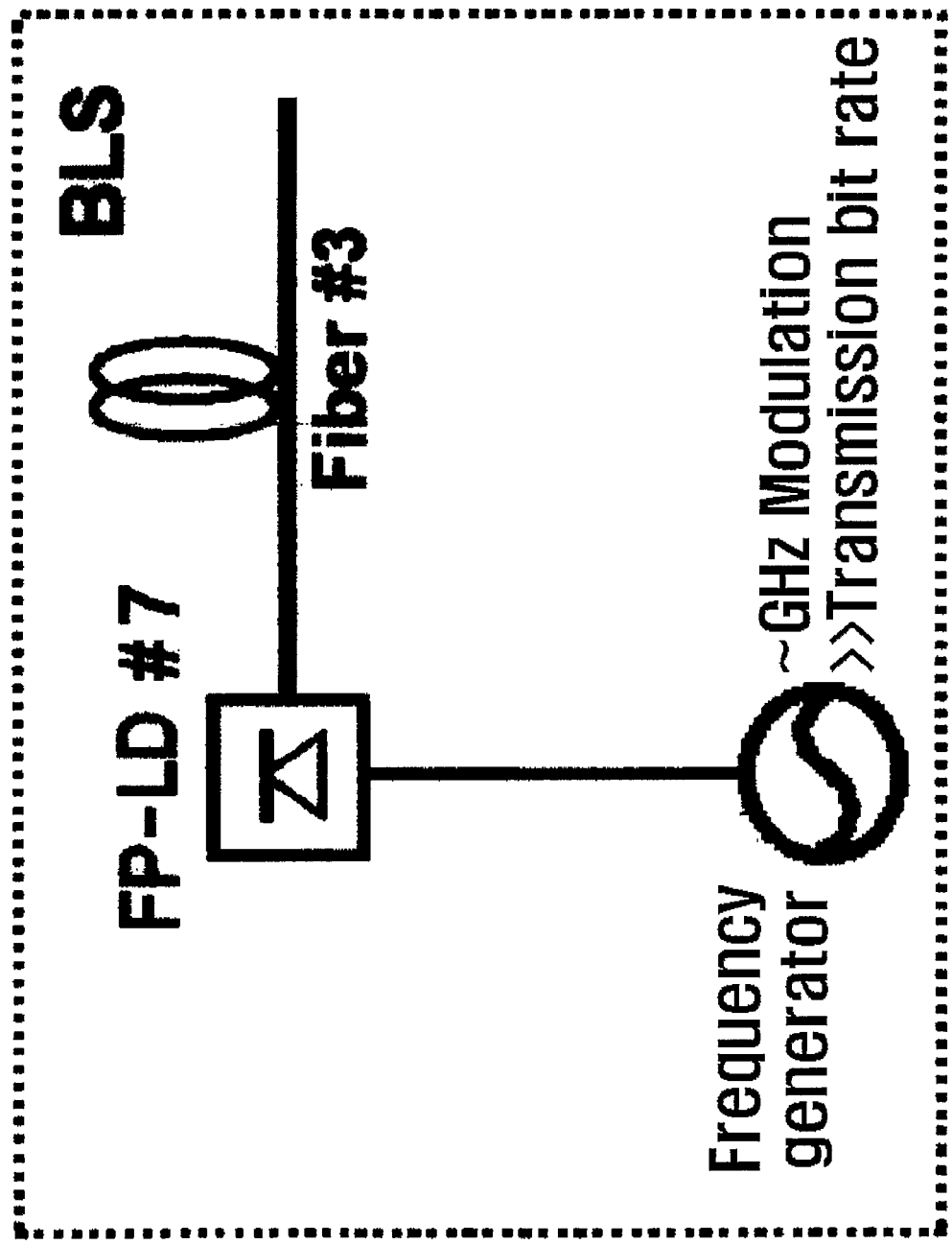
FIG. 17 illustrates a structure in which the FD LD #7 using chirping is coupled to the optical fiber.

FIG. 17 illustrates a method capable of reducing the mode partition noise by passing a spectrum undergoing chirping to an optical fiber #3. A pulse of an optical signal going through the optical fiber #3 is broadened according to chromatic dispersion. In this case, a pulse shape is illustrated in FIG. 16. FIGS. 16(a), 16(b), and 16(c) illustrate cases where length values of an optical fiber are 10 km, 30 km, and 50 km.

Figure 18:
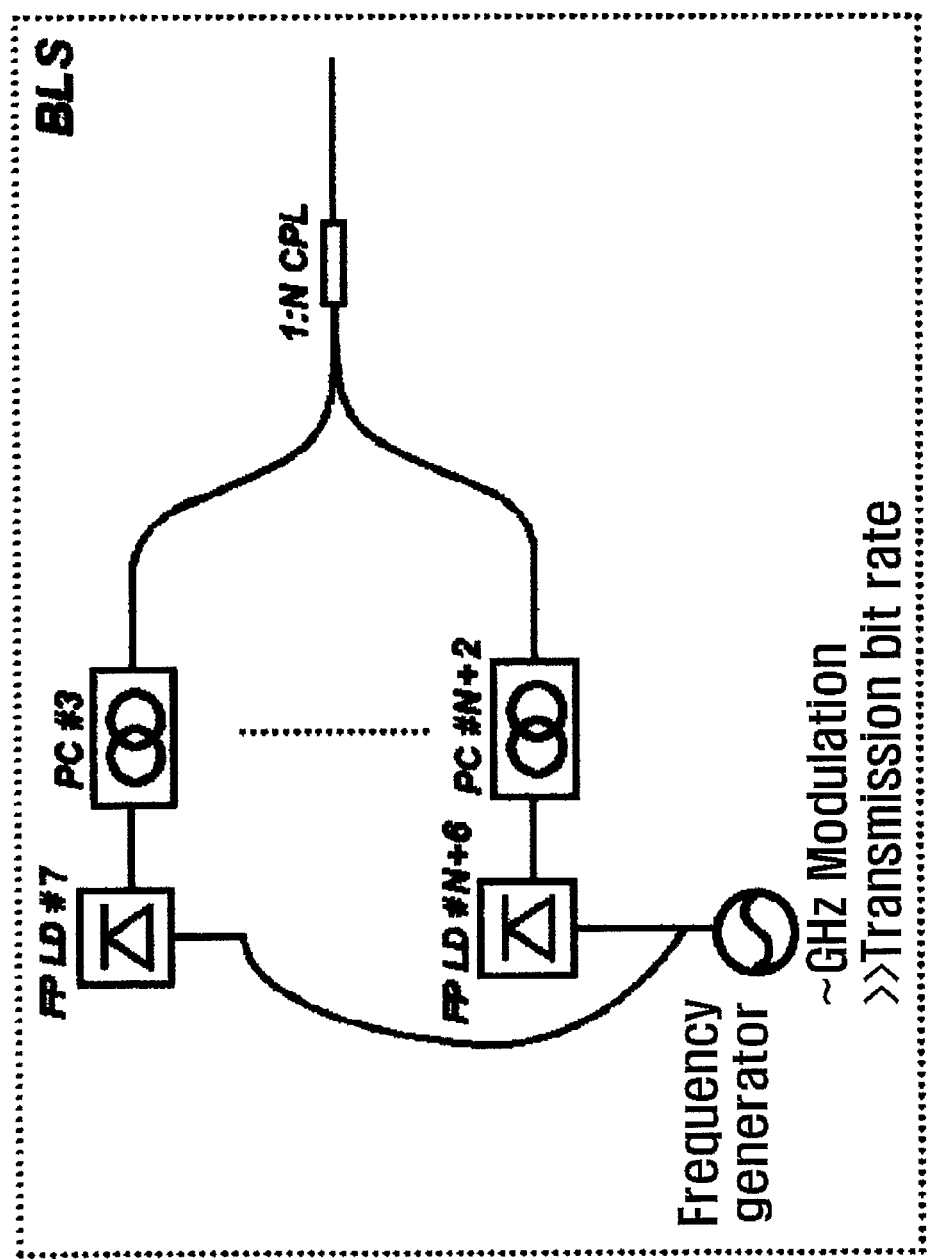
FIG. 18 illustrates a BLS using chirping of N number of FP LDs.

FIG. 18 illustrates an example of reducing mode partition noise using n FP LDs #7, . . . , #N+6 undergoing chirping and N PCs #3, . . . , #N+2.

In this case, when the n FP LDs are wavelength-locked to one mode of the BLS, an SMSR and extinction are better.

The FP LDs can use broadband FP LDs to broaden a bandwidth of incoherent light.

Although certain embodiments of the present invention have been disclosed for illustrative purposes, those skilled in the art will appreciate that various modifications, additions and substitutions are possible, without departing from the scope of the present invention. Therefore, the present invention is not limited to the above-described embodiments, but is defined by the following claims, along with their full scope of equivalents.

INDUSTRIAL APPLICABILITY

The present invention can produce high power using low-cost Fabry-Perot (FP) laser diodes (LDs). More specifically, an erbium-doped fiber amplifier (EDFA) or a high-power FP LD can be used to supplement necessary power. Accordingly, the present invention can easily implement a wavelength division multiplexing-passive optical network (WDM-PON) system with a light source of wavelength-locked FP LDs using a low-cost broadband light source (BLS).

The invention claimed is:

1. A method for generating a broadband light source using Fabry-Perot (FP) laser diodes (LDs), comprising:
generating the broadband light source by broadening an oscillation line-width of laser oscillation mode generated from at least two FP LDs by mutual injection of the at least two FP LDs.

2. A broadband light source using Fabry-Perot (FP) laser diodes (LDs), comprising:
a pair of FP LDs for generating multimode light; and
an optical coupler for coupling outputs of the pair of FP LDs,
wherein output ports of the pair of FP LDs are coupled to each other such that photons are injected between the pair of FP LDs.

3. The broadband light source of claim 2, further comprising: an isolator for receiving an output of the optical coupler, blocking reflected light, and passing transmitted light.

4. The broadband light source of claim 2, wherein the optical coupler is a 2×2 or 1×2 optical coupler.

5. The broadband light source of claim 2, wherein a transmission bit rate is controlled by adjusting a distance between the pair of FP LDs.

6. The broadband light source of claim 2, wherein an oscillating wavelength of the pair of FP LDs is controlled by adjusting a bias current or temperature of the pair of FP LDs.

7. The broadband light source of claim 2, wherein the pair of FP LDs are antireflection-coated FP LDs or high-power FP LDs.

8. The broadband light source of claim 2, wherein a bandwidth is defined using a broadband FP laser in which a gain band is broad.

9. A broadband light source using Fabry-Perot (FP) laser diodes (LDs), comprising:
a first number of FP LDs for generating multimode light; and
an optical coupler for coupling outputs of the first number of FP LDs,
wherein output ports of the first number of FP LDs are coupled to one another such that photons are injected between the first number of FP LDs.

10. The broadband light source of claim 9, further comprising: an isolator for receiving an output of the optical coupler, blocking reflected light, and passing transmitted light.

11. The broadband light source of claim 9, wherein the optical coupler is one of 1×2, 2×2, I×N, and N×N optical couplers.

12. The broadband light source of claim 9, wherein a wavelength interval between oscillation modes is controlled by adjusting a distance between the first number of FP LDs.

13. The broadband light source of claim 9, wherein an oscillating wavelength of the first number of FP LDs is controlled by adjusting a bias current or temperature of the first number of FP LDs.

14. The broadband light source of claim 9, wherein the first number of FP LDs are antireflection-coated FP LDs or high-power FP LDs.

15. The broadband light source of claim 9, wherein a bandwidth is defined using a broadband FP laser in which a gain band is broad.

16. The broadband light source of claim 9, wherein a plurality of lasers among the first number of FP LDs are modulated such that a spectrum is increased.

17. An optical transmitter, comprising:
a broadband light source comprising a first number of Fabry-Perot laser diodes ("FP LDs") for generating multimode light; an optical coupler for coupling outputs of the first number of FP LDs, wherein output ports of the first number of FP LDs are coupled to one another such that photons are injected between the first number of FP LDs;
a first arrayed waveguide grating (AWG) for filtering light into a second number of light components in a plurality of oscillation modes of the broadband light source, where the second number of light components is equal to the number of output ports of the first AWG or the number of wavelength division multiplexing (WDM) signal channels;

an optical fiber for transmission;
a third number of Fabry-Perot (FP) laser diodes (LDs) each for outputting light wavelength-locked to a light wavelength injected through the first AWG;
an optical circulator for outputting light from the first AWG; and
a second AWG for demultiplexing a WDM signal into a fourth number of signals.

18. The optical transmitter of claim 17, further comprising:
an optical fiber amplifier or a polarization controller coupled between the broadband light source and the optical circulator.

19. The optical transmitter of claim 17, wherein the third number of FP LDs for outputting light wavelength-locked to the light wavelength injected through the first AWG are anti-reflection-coated FP LDs or high-power FP LDs.

20. A method for generating an unpolarized broadband light source, comprising:
generating a broadband light source by broadening an oscillation line-width of laser oscillation mode generated from at least two Fabry-Perot laser diodes ("FP LDs") by mutual injection of the at least two FP LDs,
using outputs of two output ports of the broadband light source, or dividing and using an output of one output port of the broadband light source, to generate two polarized broadband light components for multiplexing polarized light.

21. The method of claim 20, wherein when the outputs of the two output ports of the broadband light source to generate two polarized broadband light components for multiplexing polarized light are used,
the outputs of the two output ports of the broadband light source are controlled by first and second polarization controllers, respectively, such that the outputs are horizontally and vertically polarized light components, and the horizontally and vertically polarized light components are passed to a polarization beam splitter.

22. The method of claim 20, wherein when the outputs of the two output ports of the broadband light source to generate two polarized broadband light components for multiplexing polarized light are used,
one of the outputs of the two output ports of the broadband light source is adjusted to be vertical to polarized light of the other output by a wave plate, and polarized light components vertical to each other are passed to a polarization maintaining coupler.

23. The method of claim 20, wherein when the outputs of the two output ports of the broadband light source to generate two polarized broadband light components for multiplexing polarized light are used,
polarized light components of the outputs of the two output ports of the broadband light source are adjusted to be vertical to each other by at least one polarization controller, and the polarized light components vertical to each other are passed to a polarization maintaining coupler.

24. The method of claim 20, wherein when the output of the one output port of the broadband light source is divided and used to generate two polarized broadband light components for multiplexing polarized light,
the output of the one output port of the broadband light source is separated into two components by a 1×2 optical coupler, the two components of the optical coupler are adjusted to be horizontally and vertically polarized light components by first and second polarization controllers, and the horizontally and vertically polarized light components are passed to a polarization beam splitter.

25. The method of claim 20, wherein when the output of the one output port of the broadband light source is divided and used to generate two polarized broadband light components for multiplexing polarized light,
the output of the one output port of the broadband light source is separated into two components by a 1×2 optical coupler, one component output from the optical coupler is adjusted to be vertical to polarized light of the other component by a wave plate, and polarized light components vertical to each other are passed to a polarization maintaining coupler.

26. The method of claim 20, wherein when the output of the one output port of the broadband light source is divided and used to generate two polarized broadband light components for multiplexing polarized light,
polarized light components generated from the output of the one output port of the broadband light source are adjusted to be vertical to each other by at least one polarization controller, and the polarized light components vertical to each other are passed to a polarization maintaining coupler.

27. An optical transmitter comprising:
a broadband light source comprising at least two Fabry-Perot laser diodes ("FP LDs") mutually injected into each other, wherein outputs from two output ports of the broadband light source are used to generate two polarized broadband light components to produce an unpolarized light, or one an output from one output port of the broadband light source is divided to generate the two polarized broadband light components to produce the unpolarized light;
a first arrayed waveguide grating (AWG) for filtering light into a first number of light components in a plurality of oscillation modes of the unpolarized broadband light source, where the first number is the number of output ports of the first AWG or the number of wavelength division multiplexing (WDM) signal channels;
an optical fiber for transmission;
a second number of Fabry-Perot (FP) laser diodes (LDs) for outputting light wavelength-locked to a light wavelength injected through the first AWG;
an optical circulator for outputting light input through the first AWG; and
a second AWG for demultiplexing a WDM signal into a third number of signals.

28. The optical transmitter of claim 27, further comprising:
an optical fiber amplifier or a polarization controller coupled between the broadband light source and the optical circulator.

29. The optical transmitter of claim 28, wherein the second number of FP LDs for outputting light wavelength-locked to the light wavelength injected through the first AWG are anti-reflection-coated FP LDs or high-power FP LDs.

* * * * *